United States Patent
Kishi

(10) Patent No.: US 8,463,057 B2
(45) Date of Patent: Jun. 11, 2013

(54) IMAGE ENCODING APPARATUS AND CONTROL METHOD THEREFOR

(75) Inventor: Hiroki Kishi, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 256 days.

(21) Appl. No.: 13/018,677

(22) Filed: Feb. 1, 2011

(65) Prior Publication Data

US 2011/0194767 A1    Aug. 11, 2011

(30) Foreign Application Priority Data

Feb. 8, 2010 (JP) .................................. 2010-025857

(51) Int. Cl.
*G06K 9/36* (2006.01)

(52) U.S. Cl.
USPC ........................................................ 382/232

(58) Field of Classification Search
USPC .................................................. 382/232–253
See application file for complete search history.

(56) References Cited

U.S. PATENT DOCUMENTS

| | | | | |
|---|---|---|---|---|
| 6,847,735 | B2 | 1/2005 | Kajiwara et al. | 382/233 |
| 6,879,726 | B2 | 4/2005 | Sato et al. | 382/239 |
| 6,879,727 | B2 | 4/2005 | Sato et al. | 382/239 |
| 6,917,716 | B2 | 7/2005 | Kajiwara et al. | 382/240 |
| 6,947,600 | B1 | 9/2005 | Sato et al. | 382/233 |
| 6,950,471 | B2 | 9/2005 | Kishi | 375/240.19 |
| 6,993,198 | B2 | 1/2006 | Kishi | 382/240 |
| 7,391,911 | B2 * | 6/2008 | Hwang | 382/232 |
| 7,499,592 | B2 | 3/2009 | Nakayama et al. | 382/233 |
| 7,574,063 | B2 | 8/2009 | Kajiwara et al. | 382/239 |
| 7,639,886 | B1 * | 12/2009 | Rastogi | 382/251 |
| 7,715,637 | B2 | 5/2010 | Kishi | 382/232 |
| 7,822,282 | B2 | 10/2010 | Kajiwara et al. | 382/240 |
| 2007/0036223 | A1 | 2/2007 | Srinivasan | 375/240.18 |
| 2008/0089413 | A1 | 4/2008 | Kishi et al. | 375/240.13 |

(Continued)

FOREIGN PATENT DOCUMENTS

| | | |
|---|---|---|
| JP | 2009-505494 A | 2/2009 |
| WO | 2007/021568 A2 | 2/2007 |

OTHER PUBLICATIONS

Junichi Hara, "Recent Trend in Standardization of JPEG XR", The Journal of the Institute of Image Electronics Engineers of Japan, Visual Computing Devices & Communications, vol. 37, No. 4, pp. 502-512 (Jul. 25, 2008)(with translation).

(Continued)

*Primary Examiner* — Alex Liew
(74) *Attorney, Agent, or Firm* — Fitzpatrick, Cella, Harper & Scinto

(57) ABSTRACT

An encoding unit separates converted coefficients obtained by frequency conversion into the upper-bit portion that is higher than a bit position specified by a boundary bit position determined when the previous macro block is encoded and the lower-bit portion, performs encoding on the upper-bit portion and outputs the encoded data and the lower-bit portion. When a maximum difference in the number of valid bits of the converted coefficients represented by the lower-bit portion remaining after deletion and the upper-bit portion of each pixel block when it is assumed that the number of bits i to be deleted is changed to 1, 2, . . . and so on in the range of the finite number of bits representing converted coefficients is represented as max_diff(i), a stream generating unit creates a histogram constituted by the bit number i and the frequency for max_diff(i) to determine the number of bits N to be deleted.

17 Claims, 20 Drawing Sheets

U.S. PATENT DOCUMENTS

| | | | |
|---|---|---|---|
| 2009/0252232 A1 | 10/2009 | Kishi et al. | 372/240.24 |
| 2009/0252427 A1 | 10/2009 | Kishi et al. | 382/244 |
| 2010/0067810 A1 | 3/2010 | Kishi | 382/232 |
| 2010/0216303 A1 | 8/2010 | Ohkura | 382/233 |
| 2010/0316304 A1 | 12/2010 | Kishi | 382/233 |

OTHER PUBLICATIONS

"JPEG XR Leads to 8-Bit Tone Ultra Camera", Nikkei Electronics, pp. 71-77 (Dec. 29, 2008)(with translation).

* cited by examiner

DIAGRAM SHOWING CHANGE
IN FLEXBITS IN ONE DIMENSION

DIAGRAM SHOWING CHANGE
IN FLEXBITS IN ONE DIMENSION

FIG. 8A max_diff(bit)

| NUMBER OF TRIM_BITS (BIT) | | 0 | 1 | 2 | 3 | 4 | 5 | 6 |
|---|---|---|---|---|---|---|---|---|
| | 1 | 48 | 12 | - | - | - | - | - |
| | 2 | 42 | 8 | 10 | - | - | - | - |
| | 3 | 30 | 15 | 5 | 10 | - | - | - |
| | 4 | 25 | 10 | 12 | 5 | 8 | - | - |
| | 5 | 15 | 15 | 7 | 11 | 6 | 6 | - |
| | 6 | 10 | 12 | 10 | 10 | 7 | 7 | 4 |

FIG. 8B max_diff(bit)

| NUMBER OF TRIM_BITS (BIT) | | 0 | 1 | 2 | 3 | 4 | 5 | 6 |
|---|---|---|---|---|---|---|---|---|
| | 1 | 48→49 | 12 | - | - | - | - | - |
| | 2 | 42→43 | 8 | 10 | - | - | - | - |
| | 3 | 30→31 | 15 | 5 | 10 | - | - | - |
| | 4 | 25 | 10→11 | 12 | 5 | 8 | - | - |
| | 5 | 15 | 15 | 7→8 | 11 | 6 | 6 | - |
| | 6 | 10 | 12 | 10→11 | 10 | 7 | 7 | 4 |

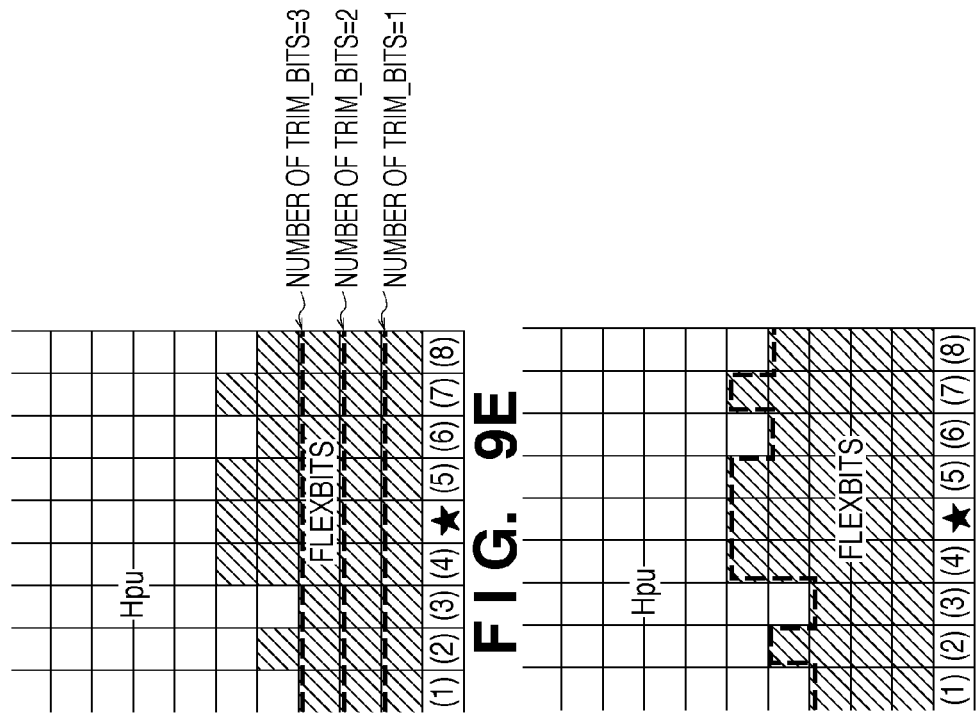

FIG. 10A max_diff(bit)

| NUMBER OF TRIM_BITS (BIT) | | 0 | 1 | 2 | 3 | 4 | 5 | 6 |
|---|---|---|---|---|---|---|---|---|
| | 1 | 12795 | 2205 | - | - | - | - | - |
| | 2 | 11202 | 2124 | 1674 | - | - | - | - |
| | 3 | 9030 | 3493 | 1634 | 843 | - | - | - |
| | 4 | 7335 | 2276 | 3290 | 1516 | 633 | - | - |
| | 5 | 4680 | 2975 | 2545 | 3290 | 1248 | 312 | - |
| | 6 | 2970 | 2941 | 3085 | 3494 | 1581 | 867 | 112 |

FIG. 10B max_diff(bit)

| NUMBER OF TRIM_BITS (BIT) | | 0 | 1 | 2 | 3 | 4 | 5 | 6 |
|---|---|---|---|---|---|---|---|---|
| | 1 | 85.3 | 14.7 | - | - | - | - | - |
| | 2 | 74.7 | 14.2 | 11.2 | - | - | - | - |
| | 3 | 60.2 | 23.3 | 10.9 | 5.6 | - | - | - |
| | 4 | 48.9 | 15.2 | 21.9 | 10.1 | 4.2 | - | - |
| | 5 | 31.2 | 19.8 | 17.0 | 21.9 | 6.3 | 2.1 | - |
| | 6 | 19.8 | 19.6 | 20.6 | 23.3 | 10.5 | 5.8 | 0.7 |

※ NUMERICAL VALUES IN THE TABLE DENOTE RATE (%)

FIG. 10C

SUM of diff(bit)

| NUMBER OF TRIM_BITS (BIT) | | 0~2 | 3~5 | 6~8 | 9~12 | 13~17 | 18~25 | ........ |
|---|---|---|---|---|---|---|---|---|
| | 1 | | | | | | | ........ |
| | 2 | | | | | | | ........ |
| | 3 | | | | | | | ........ |
| | 4 | | | | | | | ........ |
| | 5 | | | | | | | ........ |
| | 6 | | | | | | | ........ |

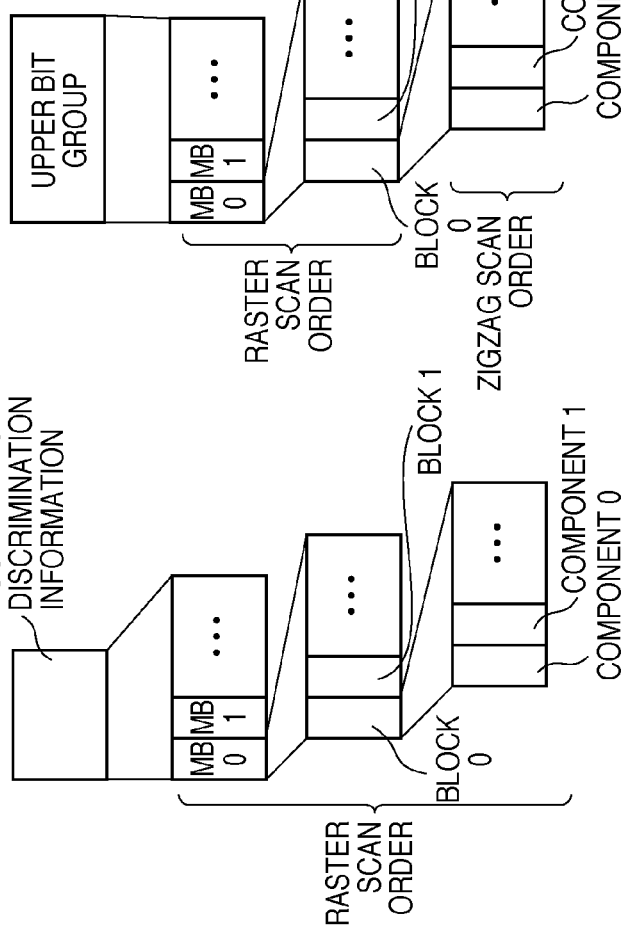
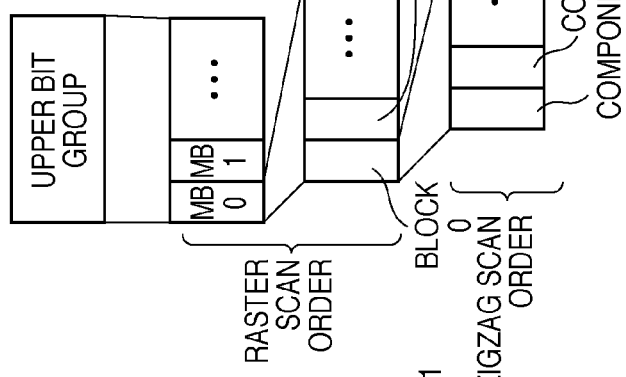
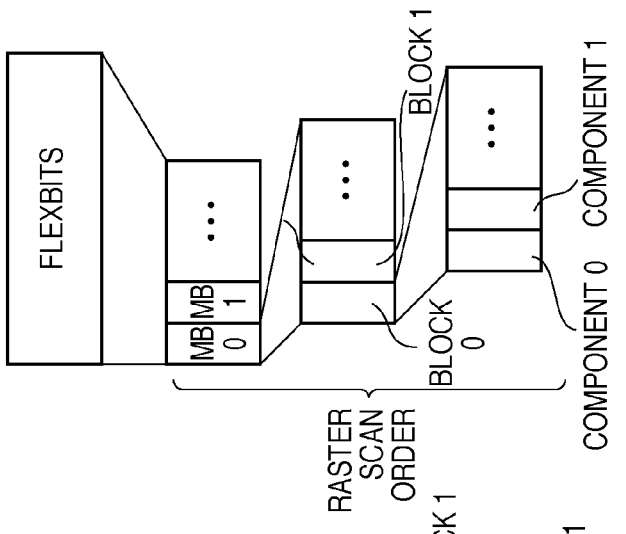
FIG. 15E
FIG. 15D
FIG. 15C

FIG. 17A

|   | a | b | c |
|---|---|---|---|
| d | e | f | g |
| h | i | j | k |
| l | m | n | o |

FIG. 17B

| ADDRESS | a | b | c | d | e | f | g | h | i | ... |
|---|---|---|---|---|---|---|---|---|---|---|
| COEFFICIENT VALUE | 4 | -3 | 0 | -2 | -4 | 1 | -8 | 0 | 3 | ... |
| SIGN | + | - | NA | - | - | + | - | NA | + | ... |
| BINARY REPRESENTATION OF ABSOLUTE VALUE | 0 | 0 | 0 | 0 | 0 | 0 | 1 | 0 | 0 | ... |
| SIGN-MAGNITUDE REPRESENTATION | 1 | 0 | 0 | 0 | 1 | 0 | 0 | 0 | 0 | ... |
|  | 0 | 1 | 0 | 1 | 0 | 0 | 0 | 0 | 1 | ... |
|  | 0 | 1 | 0 | 0 | 0 | 1 | 0 | 0 | 1 | ... |

FIG. 17C

| ADDRESS | a | b | c | d | e | f | g | h | i | ... | |
|---|---|---|---|---|---|---|---|---|---|---|---|
| COEFFICIENT VALUE | 4 | -3 | 0 | -2 | 4 | 1 | -8 | 0 | 3 | ... | UPPER BIT PORTION |
| SIGN | + | - | NA | - | - | + | - | NA | + | ... | |
| UPPER BIT GROUP | 0 | 0 | 0 | 0 | 0 | 0 | 1 | 0 | 0 | ... | |
|  | 1 | 0 | 0 | 0 | 1 | 0 | 0 | 0 | 0 | ... | |
| FLEXBITS | 0 | 1 | 0 | 1 | 0 | 0 | 0 | 0 | 1 | ... | FLEXBITS |
|  | 0 | 1 | 0 | 0 | 0 | 1 | 0 | 0 | 1 | ... | |

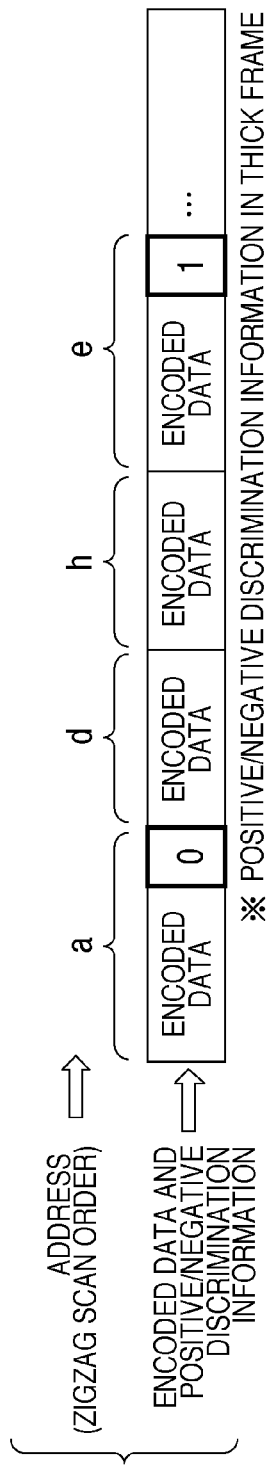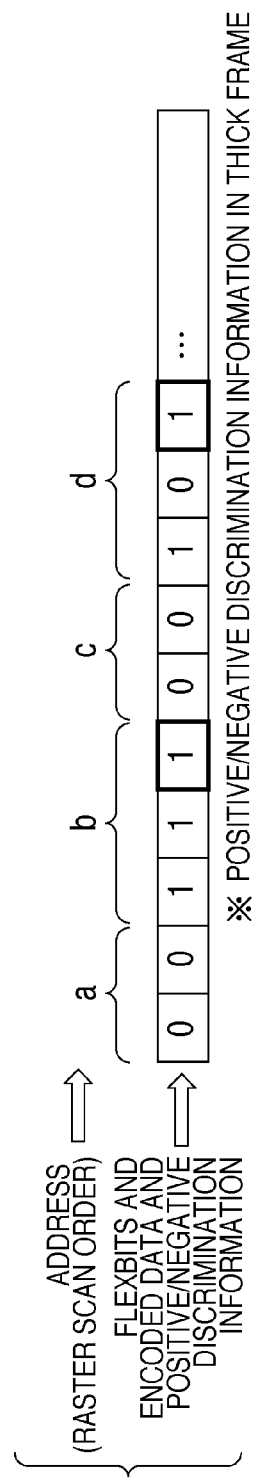

IMAGE ENCODING APPARATUS AND CONTROL METHOD THEREFOR

BACKGROUND OF THE INVENTION

1. Field of the Invention

The present invention relates to technology for encoding image data.

2. Description of the Related Art

In order to efficiently handle digital images, image compression to reduce the file size thereof is indispensable. Examples of documents that disclose such technology include Japanese Patent Laid-Open No. 2009-505494 (hereinafter, Document 1), "Recent trend in standardization of JPEG XR" Institute of Image Electronics Engineers of Japan, Vol. 37, No. 4: pp. 502-512, Jul. 25, 2008 (hereinafter, Document 2), and Nikkei Electronics Dec. 29, 2008: pp. 71-77, Dec. 29, 2008 (hereinafter, Document 3).

With technology on the basis of the above technology, a macro block (MB) having a 16×16 pixel size is defined, frequency conversion is performed, and thereafter quantization and entropy encoding are performed. In entropy encoding, high frequency coefficients that are encoding targets are regarded as values of natural binary representation, and separated into upper bits and lower bits as shown in FIG. 6. The upper bits are referred to as HPu (HP upper), and the lower bits are referred to as FLEXBITS. With these two types of data, HPu have many "0" bits and can be easily compressed, and thus Huffman encoding is implemented thereon. On the other hand, FLEXBITS have substantially randomly "0" and "1" bits and cannot be easily compressed, and thus are output without being compressed. Moreover, taking the effect of compression into consideration, it is desirable to change the bit number of FLEXBITS in an image rather than fixed it. Because, if a region not including many edges is compared with a region including many edges, in the former region, bits close to an LSB (Least Significant Bit) also include many "0" bits. On the other hand, in the latter region, even bits close to an MSB (Most Significant Bit) include "0" and "1" bits that tend to exist randomly. That is, it is better to assign a small bit number of FLEXBITS to the former region so as to increase the number of bits that are to be encoded as HPu. The opposite applies to the case of the latter region. In consideration of this point, with technology based on Document 1 and the like, a mechanism for dynamically changing the bit number of FLEXBITS in the range of ±1 between MBs adjoining in a main scanning direction in units of macro blocks is adopted. Here, the reason for setting a limitation, that is, "the range of ±1", is that the same number of bits in an entire image can delete lower bits of FLEXBITS. Consequently, this suppresses a state where a great difference in image quality may be generated between adjoining MBs in the case where all FLEXBITS are deleted or the like.

However, there is no restriction placed on the difference in the bit number of FLEXBITS with respect to MBs except between MBs adjoining in the main scanning direction. For example, with JPEG XR, how much difference there is in the bit number of FLEXBITS between two MBs at separate positions in an image or between MBs adjoining in the sub-scanning direction is unknown. Accordingly, a difference in image quality may be generated between MBs depending on the number of bits to be deleted. In particular, if a difference in image quality occurs between MBs adjoining in the sub-scanning direction, this will be perceived as distortion and become a problem.

SUMMARY OF THE INVENTION

The present invention has been conceived in view of the above conventional examples. The present invention provides encoding technology to update a boundary bit position where converted coefficients that are the results of frequency conversion are separated into an upper-bit portion and a lower-bit portion by only 1 bit at the maximum while performing encoding in units of pixel blocks in the preset scanning order, the technology allowing the reduction of the amount of encoded data while taking into consideration the difference in image quality for each pixel block.

In order to solve the above-described problems, for example, the present invention in its aspect provides an image encoding apparatus that encodes image data, comprising: an encoder that performs frequency conversion on an image, separates obtained converted coefficients into an upper-bit portion and a lower-bit portion per block, and generates encoded data; a boundary acquiring unit that acquires a boundary bit position between the upper-bit portion and the lower-bit portion of each block; an image quality calculating unit that calculates a feature value that is determined based on a difference between the boundary bit position of a block of interest and the boundary bit position of a surrounding block, and the number of bits to be deleted from the lower-bit portion starting from a least significant bit in each block; and a determination unit that determines, based on the feature value, the number of bits to be deleted from the lower bit portion starting from the least significant bit in each block.

According to the present invention, with encoding technology for updating a boundary bit position where converted coefficients that are the results of frequency conversion are separated into an upper-bit portion and a lower-bit portion by only 1 bit at the maximum while performing encoding in units of pixel blocks in the preset scanning order, the amount of encoded data can be reduced while taking into consideration the difference in image quality for each pixel block.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, and serve to explain the principles of the invention.

FIGS. 5A to 5D are circuit diagrams of stream conversion.

FIGS. 8A and 8B are histograms in the first embodiment.

FIGS. 9A to 9E are explanatory diagrams of distortion (feature values) in macro blocks in the first embodiment.

FIGS. 10A to 10C are explanatory diagrams of distribution tables of the occurrence of distortion.

FIGS. 15A to 15E are explanatory diagrams of a code stream generating method.

FIGS. 17A to 17F are explanatory diagrams with regard to deletion of FLEXBITS in other embodiments.

DESCRIPTION OF THE EMBODIMENTS

Hereinafter, embodiments according to the present invention are described in detail in accordance with the attached drawings.

First Embodiment

Figure 16:
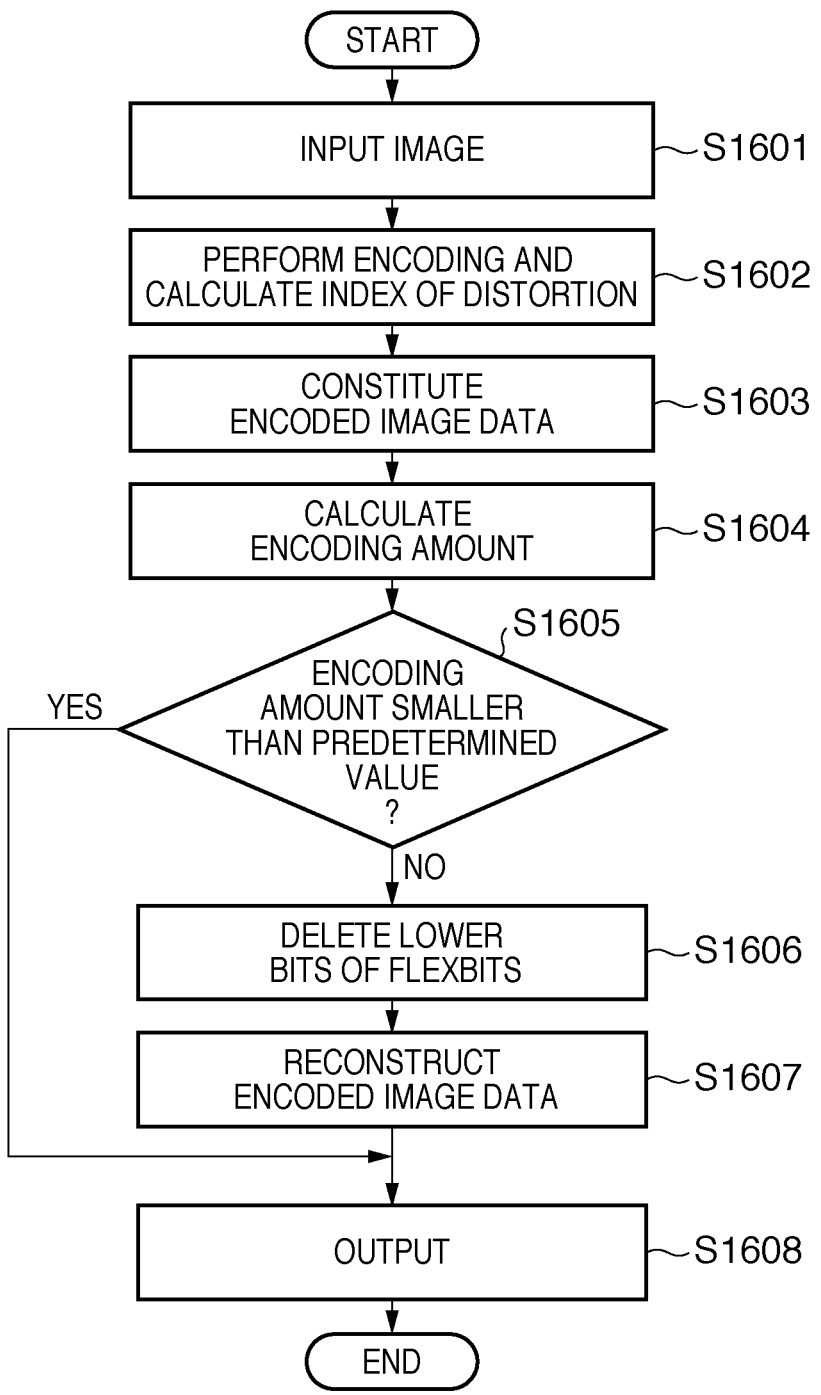
FIG. 16 is a flowchart of processing in the first embodiment.

In the present embodiment, an example in which if the encoding amount of encoded image data that is the result of encoding an image is greater than or equal to a predetermined value, the occurrence of distortion is suppressed to the minimum, and signs are deleted is described below. The rough flow of the processing is as shown in FIG. 16. An image is input (S1601) and encoded after that (S1602). In parallel thereto, a plurality of bit numbers to be deleted are postulated with respect to the FLEXBITS, an index (feature value) that indicates distortion that occurs in the image is calculated with respect to each of the bit numbers (S1602). Such an index will be described later. A header indicating conditions of encoding is generated after encoding and calculation of the index of the occurrence of distortion end. Then, encoded image data is constituted by arranging the header and data obtained by encoding in a memory (S1603). Subsequently, the encoding amount of the encoded image data is calculated (S1604), and the calculated encoding amount is compared with a predetermined value (S1605). If the encoding amount is less than the predetermined value, the encoded image data is output (S1608), and processing ends. On the other hand, if the encoding amount is greater than or equal to the predetermined value, the number of bits to be deleted (the number of trim_bits) is determined based on the index, and lower bits of FLEXBITS are deleted by the number of trim_bits (S1606). Then, encoded image data is reconstructed (S1607) and output (S1608). Note that an index (feature value) that indicates the occurrence of distortion is defined as follows. As described above, if FLEXBITS are deleted, a difference may be generated between a macro block (MB) of interest and each surrounding MB in the number of bits to be decoded, thereby generating a difference in image quality therebetween, which will be perceived as distortion. Further, it seems that the quality of the entire image becomes deteriorated the greater the magnitude of distortion is and the more locations distortion occurs at. That is, the quality of an image is determined by the degree of the occurrence of distortion. In view of this, in the present embodiment, a difference (diff) in the number of bits to be decoded between the MB of interest and one arbitrary MB that exists around the MB of interest is calculated. Moreover, the magnitude of distortion that occurs in each MB is determined based on diff. Then, a rate of the occurrence of MBs each having diff greater than or equal to a predetermined value is calculated, and the calculated rate is defined as an index.

Figure 1:
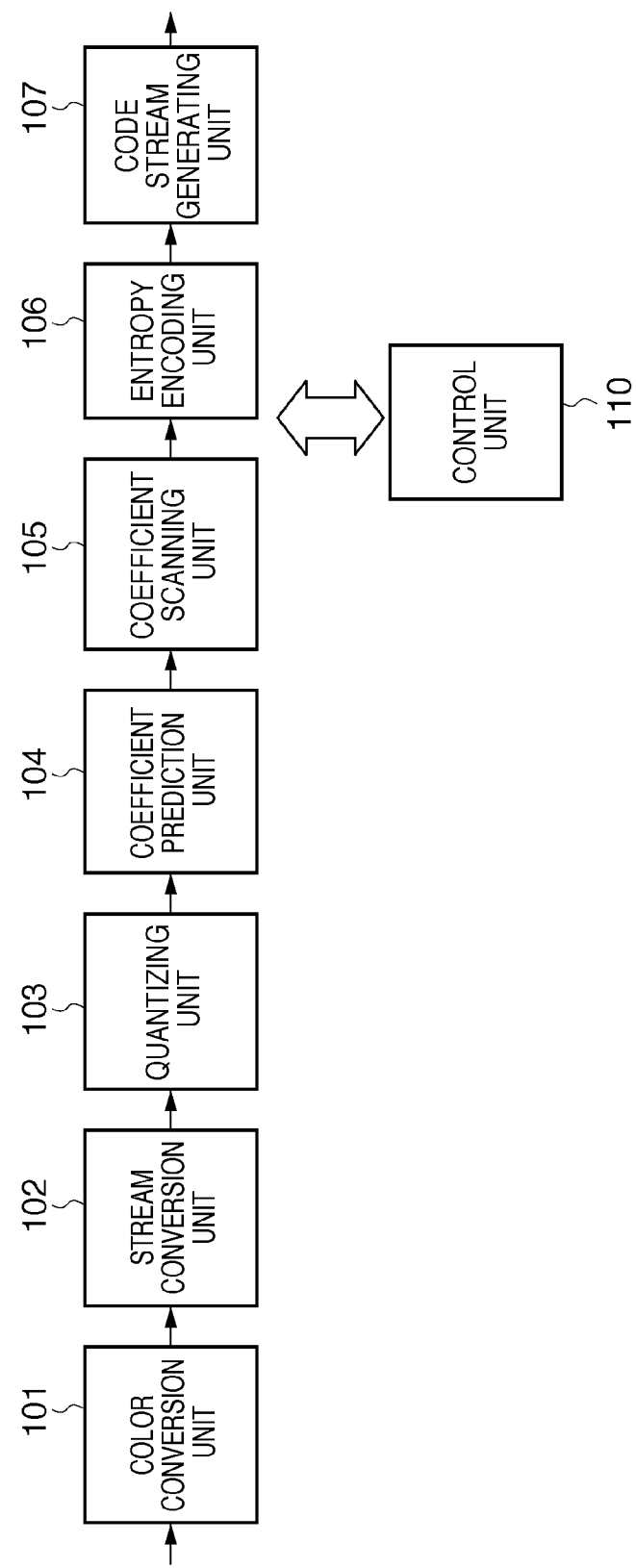
FIG. 1 is a block configuration diagram of an image processing unit in a first embodiment.

FIG. 1 is a block configuration diagram of an image encoding apparatus in the embodiment. As shown in the diagram, this apparatus is constituted by a color conversion unit 101, a stream conversion unit 102, a quantizing unit 103, a coefficient prediction unit 104, a coefficient scanning unit 105, an entropy encoding unit 106, a code stream generating unit 107, and a control unit 110 that performs overall control of the apparatus.

Figure 2:
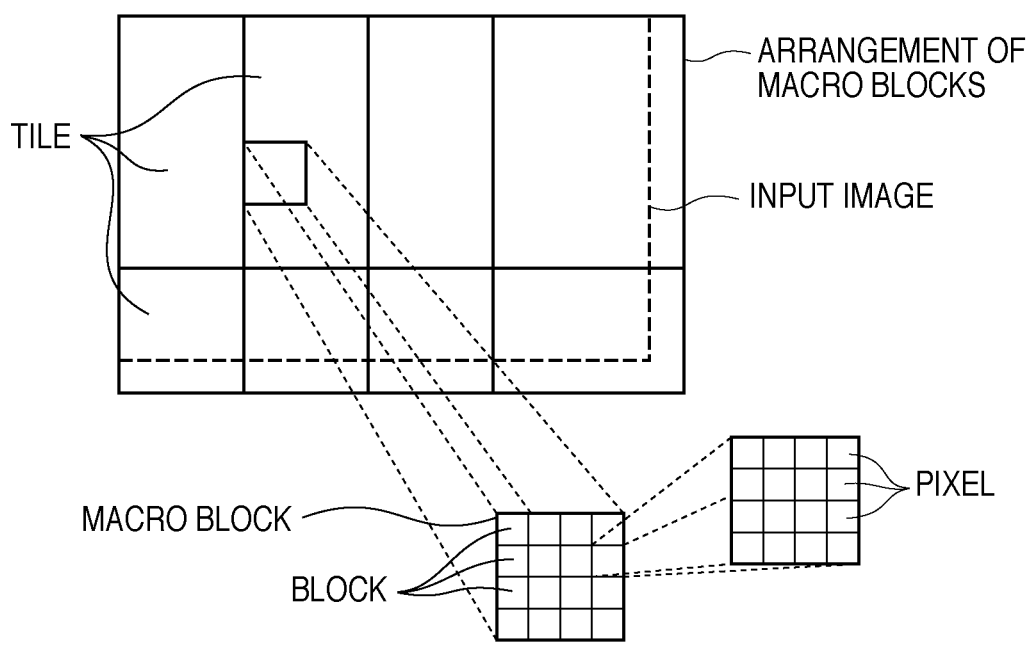
FIG. 2 is a diagram showing the relationship between tiles, macro blocks, and blocks in an image.

Terms are defined prior to description. A block is a minimum unit of encoding processing and is the size of 4×4 pixels in the embodiment. A macro block is a unit including a plurality of blocks, and represents a 4×4 block (in other words, 16×16 pixels) in the embodiment. A tile is a unit including a plurality of macro blocks, and constituted by M×N macro blocks (M and N being integers of 1 or more). The relationship between blocks, macro blocks, and tiles is shown in FIG. 2. In the present embodiment, an example in which one tile is assigned to one image is described. That is, tile division is not performed.

The color conversion unit 101 converts RGB data (in the embodiment, each component is represented by 8 bit, which is 256 tones) into YUV color space, and outputs a conversion result to the stream conversion unit 102. Conversion from RGB to YUV is performed in accordance with the transformations shown below, for example.

$V=B-R$ $t=R-G+\text{Ceiling}(V/2)$ $U=-t$ $Y=G+\text{Floor}(t/2)$ (Here, Ceiling(x) is a function that returns a minimum integer value greater than or equal to a real number x, and Floor(x) is a function that returns a maximum integral value smaller than or equal to the real number x.)

Encoding processing on Y, U, and V components is processed individually. Thus, Y (luminance) is described below to simplify description. Specifically, it should be noted that image data in the following description means image data expressed by the Y component (description with regard to U and V components is to be understood by properly replacing Y component thereby).

Figure 3:
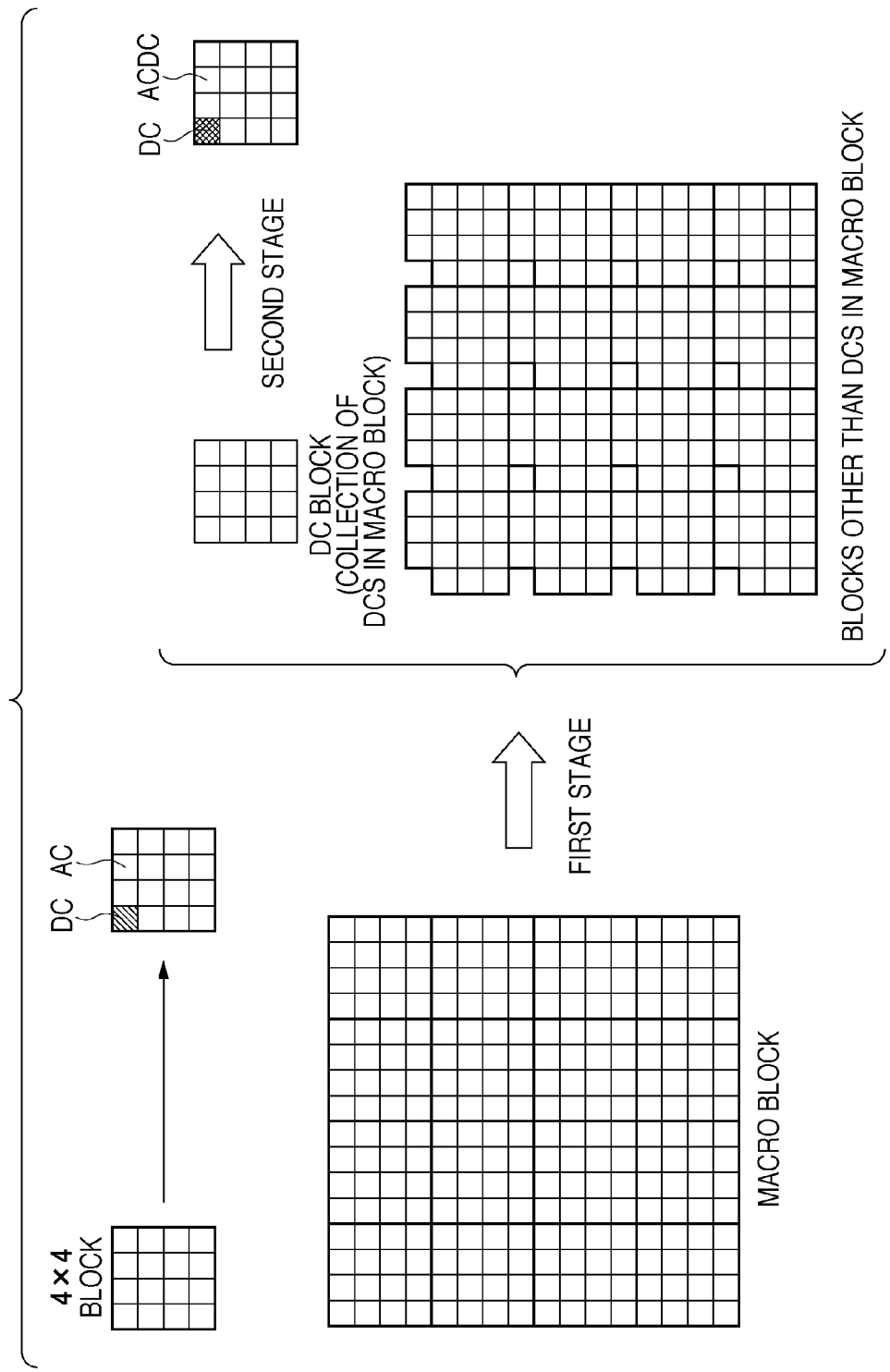
FIG. 3 is a diagram illustrating stream conversion processing.

The stream conversion unit 102 executes frequency conversion processing twice. This processing is specifically described using FIG. 3.

First, block division for generating 4×4 blocks from one macro block is performed, and frequency conversion processing is performed on each of the blocks. From one block, one DC component (direct current component) data piece and 15 (=4×4−1) AC component (alternating current component) data pieces are obtained. As described above, since one macro block is constituted by 4×4 blocks, 4×4 DC component data pieces and 15×4×4 AC component data pieces are obtained from one macro block. A collection of such 4×4 DC component values is referred to as a DC block. The processing so far is first frequency conversion processing (first frequency conversion).

Next, second frequency conversion processing (second frequency conversion) is described. A target for the second frequency conversion is the DC block described above, and the processing is the same as the first frequency conversion processing. As a result, one DC component value and 15 AC component values are obtained from the DC block. The latter AC component values are AC components calculated from DC components of the DC block (4×4 pixels), and are thus shown as ACDC components in FIG. 3. Note that DC component data and AC component data obtained by the first frequency conversion are also referred to as first level DC component data and first level AC component data. DC component data and ACDC component data obtained by the second frequency conversion may also be referred to as second level DC component data and second level AC component data. Here, frequency conversion processing is performed following the procedure shown in the flowchart in FIG. 4. Note that the flowchart is for one block (4×4 pixels). Specifically, since a macro block is constituted by 4×4 blocks, processing in accordance with the flowchart in FIG. 4 will be performed 16 times in the first frequency conversion processing.

Figure 4:
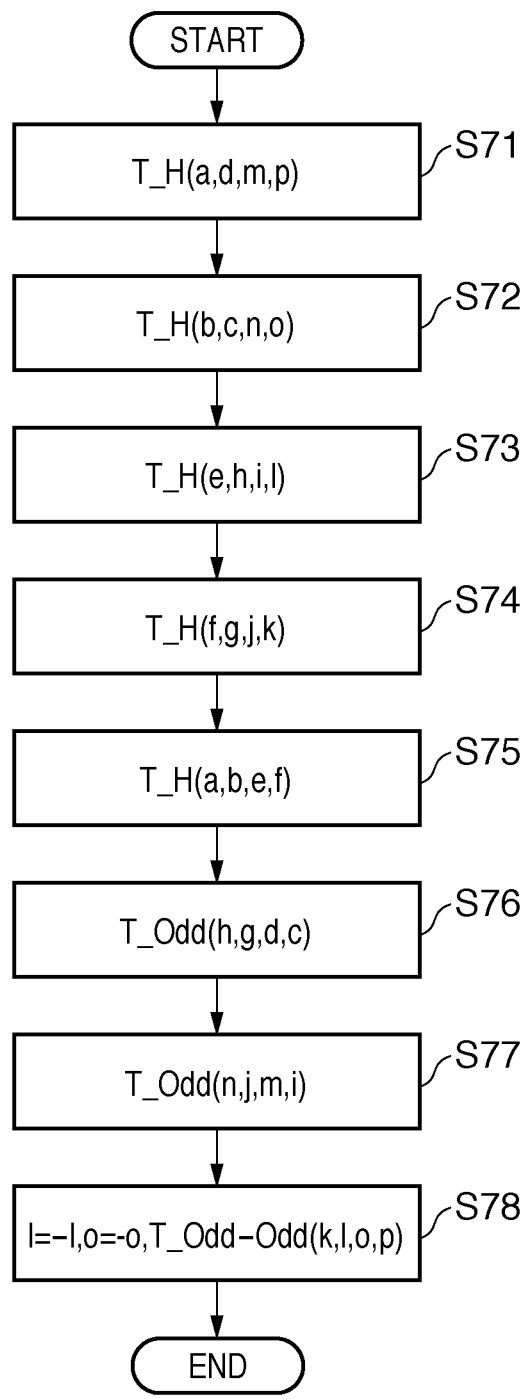
FIG. 4 is a flowchart showing a processing procedure of stream conversion processing.
Figure 5A:
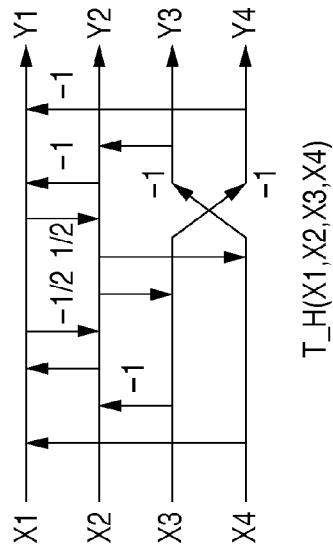
Figure 5B:
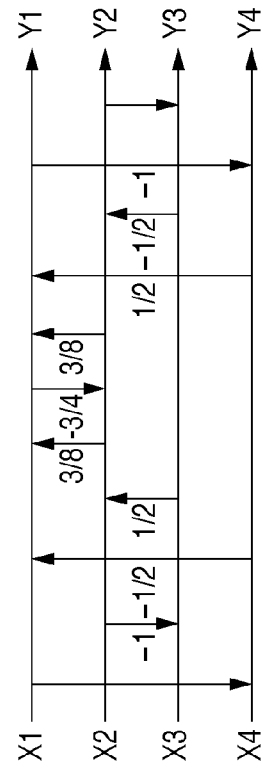
Figure 5C:
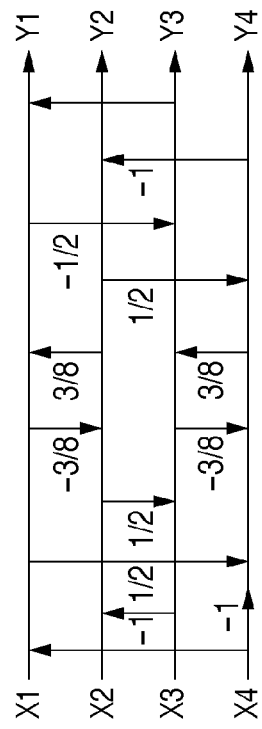
Figure 6:
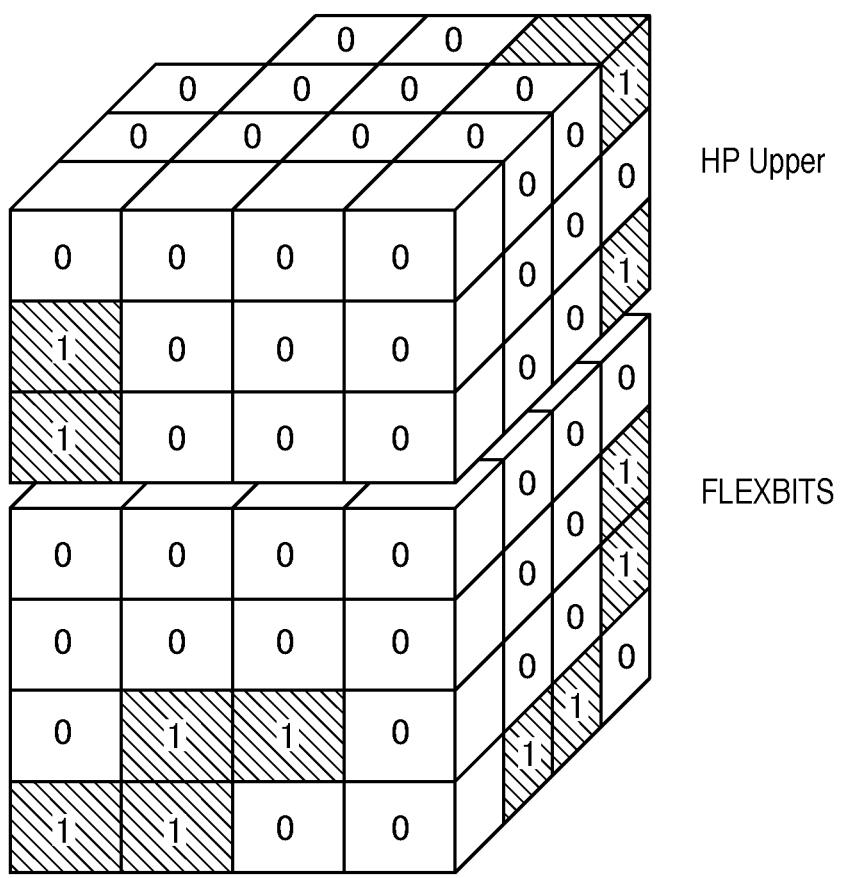
FIG. 6 is an explanatory diagram of an upper bit group and FLEXBITS.

Note that conversion processing (filtering processing) in steps S71 to S78 in the flowchart in FIG. 4 is executed using one of conversion circuits (filtering circuits) having a corresponding name in FIGS. 5B to 5D. Further, arguments a to p in the conversion processing in FIG. 4 correspond to positions of pixels a to p in the block of interest in FIG. 5A.

It is shown that conversion processing T_H (a, d, m, p) in a first processing step S71 in FIG. 4 is executed by the circuit configuration in FIG. 5B. Specifically, a, d, m, and p in FIG. 5A are respectively set in input terminals X1, X2, X3, and X4 in FIG. 5B, and computation is caused to start. The original values of a, d, m, and p are updated by four values that appear at output terminals Y1, Y2, Y3, and Y4. Processing is performed in the same way in step S72 and the following steps. Note that step S78 indicates that the positive/negative sign of data 1 and o is reversed, and thereafter T_Odd_Odd computing processing (see FIG. 5D) is performed. If processing in FIG. 4 is plainly described with regard to a DC component, in the first four processes (steps S71 to 74), from data of a block of interest (4×4 pixels), temporary low-frequency components are concentrated at positions of 2×2 pixels at the upper left corner (positions of a, b, e, and f in FIG. 5A). Then, in step S75, one DC component of the block of interest is stored at the position of "a" in FIG. 5A, using 2×2 data pieces of temporary low-frequency components stored at the positions of {a, b, e, f} at the upper left corner. Further, 15 AC components are generated through the course of processing in steps S71 to S78. The first frequency conversion processing is performed on each of the 16 blocks included in the macro block of interest in FIG. 4. Further, in the second frequency conversion processing, it is sufficient to perform processing shown in the flowchart in FIG. 4 once, regarding the DC blocks obtained from the macro block of interest (4×4 DC component values) being in the arrangement in FIG. 5A. As described above, by performing the frequency conversion processing twice, one DC component, 15 (=4×4−1) ACDC components, 240 (=15× 4×4) AC components can be obtained from one macro block.

Processing described above is processing performed by the stream conversion unit 102 in FIG. 1. The stream conversion unit 102 outputs the above conversion results to the subsequent quantizing unit 103. The quantizing unit 103 quantizes coefficients of DC, ACDC, and AC components using quantization steps designated from the outside. Since quantization is not the essence of the present invention, detailed description thereof is omitted.

Upon finishing the quantization processing as described above, the quantizing unit 103 outputs quantized data to the coefficient prediction unit 104. The coefficient prediction unit 104 performs coefficient prediction, and outputs prediction error therebetween. Only DC components are the target in coefficient prediction, and a prediction error of DC components between the macro block of interest and the previous macro block in the raster scan order is calculated.

The above is description of processing performed by the coefficient prediction unit 104. As a result of prediction processing performed by the coefficient prediction unit 104, a prediction error of DC components, a plurality of component values of ACDC and AC components are output to the coefficient scanning unit 105. The coefficient scanning unit 105 has a buffer that stores a plurality component values of ACDC and AC components, performs zigzag scan on blocks of ACDC and AC components similarly to coefficient scanning according to the JPEG method, and rearranges the blocks in the internal buffer. Details thereof are not the essence of the present invention, and thus omitted.

The entropy encoding unit 106 performs entropy encoding on the values arranged in the internal buffer in the coefficient scanning unit 105. In the present embodiment, Huffman encoding is performed on DC and ACDC components.

Below is description of encoding of AC components performed by the entropy encoding unit 106. Each AC component is first changed into sign-magnitude representation. Then, it is determined whether each of the components is positive or negative, and positive/negative discrimination information is generated. This information is 1-bit information per one coefficient, and is 0 if the component is positive, and 1 if the component is negative. Note that with regard to a component whose absolute value is zero, although such a component does not need positive/negative discrimination information, it is necessary to give such information in order to enable decoding of positive/negative discrimination information of each component. In the present embodiment, 0 is given. Subsequently, absolute values of the components are separated into an upper bit group that is higher than a boundary bit position in a bit depth direction and a lower bit group that is lower than or equal to the boundary bit position. Since there is a high probability that the upper bit group has the same value continuously, the upper bit group is a target for encoding, and Huffman encoding is performed thereon after performing zigzag scan. Since the values expressed in the lower bit group has little continuity, the lower bit group is not encoded and output without being compressed. FLEXBITS are constituted by data of lower bits of the component values that is not encoded. The bit number of FLEXBITS (num_flex_bits) is set (changed) for each macro block and dynamically determined. The determination way is as follows: an initial value is given to num_flex_bits of the first macro block when macro blocks are seen in the raster scan order. In the present embodiment, 2 is determined as the initial value, specifically, 2 lower bits of AC coefficients are determined as FLEXBITS. Note that if AC coefficients are expressed with N bits, the number of upper bits can also be referred to as N−2, and the number of lower bits can also be referred to as 2.

Then, encoding is performed on the upper bit group of converted coefficients of the first macro block, and furthermore an index value of the encoding efficiency shown by the upper bit group is calculated. Specifically, in the embodiment, the number of non-zero coefficients (or on the contrary, zero coefficients) of the upper bit group is counted. If the number of non-zero coefficients is a predetermined threshold value Num1 or more, it can be said that compression efficiency for that upper bit group is not high, and thus with respect to the second macro block to be encoded next, num_flex_bits is increased by 1 bit in order to further move a boundary position that separates upper bits and lower bits by 1 bit in the upper level direction. That is, num_flex_bits is set to 3. On the other hand, if the number of non-zero coefficients is less than a predetermined threshold value Num2, it can be said that the encoding efficiency for the upper-bit portion of the first macro block is good. That is, it can be said that the number of bits of the upper-bit portion may be further increased. In view of this, to prepare for encoding the second macro block, num_ flex_bits is reduced by 1 bit in order to move the boundary bit position by 1 bit in the lower level direction. That is, num_flex_bits is set to 1. Here, if Num1 is greater than Num2, the number of non-zero coefficients is Num2 or more and less than Num1, num_flex_bits is not changed (maintained). That is, num_flex_bits is 2. With respect to the third macro block and subsequent macro blocks, this processing is repeated, and num_flex_bits is determined. That is, the number of non-zero coefficients of the upper bit group of the ith macro block is counted. Then, num_flex_bits of the i+1th macro block is determined. The reason for limiting a bit increase/decrease to ±1 described here is to suppress change in the image quality in units of macro blocks when deletion of FLEXBITS is performed since FLEXBITS can be deleted by the same number of bits from the entire image after encoding with the present encoding method. Note that the value of num_flex_bits is a value that is 0 or more and less than or equal to the number of bits representing that of AC coefficients, which does not need to be described. Accordingly, even if, for example, the value of num_flex_bits of a macro block previous to the macro block of interest is 0, and the number of non-zero coefficients thereof is less than Num2, num_flex_bits of the macro block of interest is maintained "0" (is not reduced by 1).

Figure 7A:
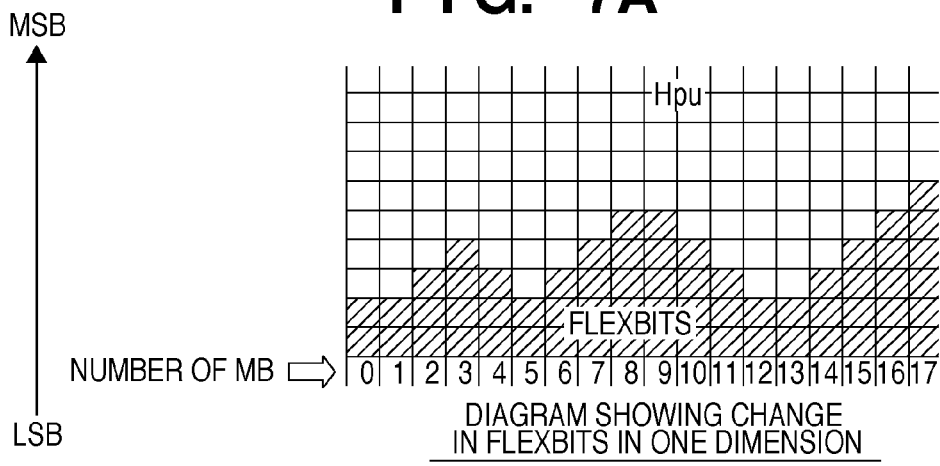
FIGS. 7A to 7C are explanatory diagrams of change in FLEXBITS.
Figure 7B:
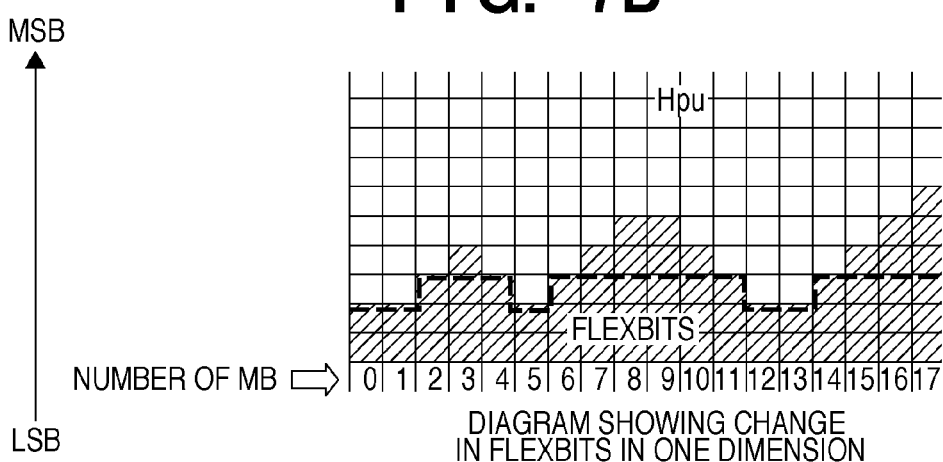
Figure 7C:
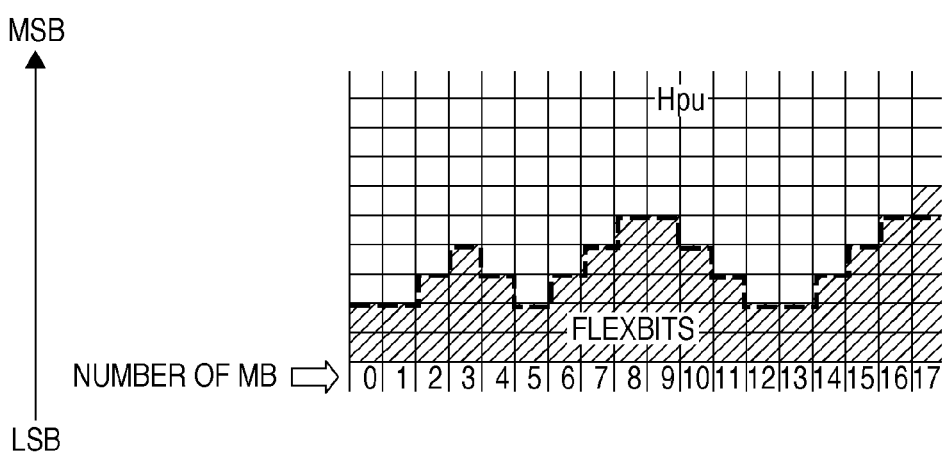

The above specific example is described using FIGS. 7A to 7C. FIG. 7A shows distribution of the upper bit group (hereinafter, referred to as HPu, which has already been described) and FLEXBITS of macro blocks after rearranging the macro blocks arranged in two dimensions in one dimension in the raster scan order. The diagram shows that the bit number of FLEXBITS of macro blocks given number 0 and 1 is 2. Similarly, it shows that the bit number of FLEXBITS of a macro block given number 2 is 3, and that of a macro block given number 3 is 4. Moreover, FIG. 7B shows the number of bits that can be decoded by the white dashed line in the case where lower 3 bits of FLEXBITS are deleted. The diagram shows that since the bit number of FLEXBITS of the macro blocks given number 0 and 1 is 2, even if lower 3 bits of FLEXBITS are desired to be deleted, only 2 bits can be deleted. With regard to the macro blocks given number 2 and 3, since the bit number of FLEXBITS is 3 or more, lower 3 bits can be deleted. Similarly, FIG. 7C shows the case where lower 5 bits are deleted. As shown in these diagrams, diff is zero bit or 1 bit between adjoining macro blocks in the main scanning direction. That is, change in the image quality in the main scanning direction is suppressed to 1 bit worth of change at most.

However, since restriction on setting of num_flex_bits is not provided between macro blocks in directions other than the main scanning direction, a large number of great differences in image quality (distortion) may occur after FLEX-BITS are deleted. Accordingly, deletion needs to be performed such that occurrence of distortion is suppressed to within an allowable range. For this, it is necessary to postulate a number of bit numbers to be deleted, and analyze a rate of the occurrence of MBs for different levels of distortion. In view of this, in the present embodiment, in order to include not only the main scanning direction but also other directions, when a maximum difference in the valid bit number of converted coefficients represented by the lower-bit portion remaining after deletion and the upper-bit portion of the macro blocks when it is assumed that the number of bits i to be deleted is changed to 1, 2, and so on with respect to each of a plurality of macro blocks positioned in a two-dimensional region within a preset distance from a block of interest is represented as max_diff(i), a histogram constituted by the number of bits i and the frequency for max_diff(i) is created. The appearance ratio with respect to the bit number i and the max_diff(i) is calculated by dividing the frequency in the histogram by the number of macro blocks that appear, and the calculated appearance ratio is set as a distortion evaluation value (feature value) for the number of bits i to be deleted. The code stream generating unit 107 obtains, from the histogram, a value at which the bit number i is maximized at or below the appearance ratio of max_diff(i) that the user has preset, and determines this bit number i as the number of bits to be actually deleted. Below is more specific description.

For example, distribution of the number of FLEXBITS is considered using a macro block of interest and eight macro blocks surrounding the macro block as shown in FIGS. 9A and 9B.

A portion of FLEXBITS equivalent to the number of bits N to be deleted that has been set is deleted in the embodiment, and there are conditions as described below. Specifically, when the number of trim_bits of a macro block of interest is n (the number of boundary bits n), if N≦n, N bits starting from the least significant bit of FLEXBITS of the macro block of interest are deleted. Further, if N>n, bits starting from the least significant bit of FLEXBITS of the macro block of interest up to the n bit are deleted. In short, the number of bits exceeding the number of trim_bits of the macro blocks is set as the upper limit for deletion. Based on such a point, the number of FLEXBITS of the macro block of interest and eight surrounding macro blocks in the vicinity thereof is 3 or more, as shown in FIGS. 9A and 9B. Accordingly, as long as the number of bits to be deleted is between 1 to 3, nine valid bit numbers each represented by the lower-bit portion remaining after deletion and the upper-bit portion are the same as each other, and thus max_diff indicating the magnitude of distortion is 0 (see FIG. 9C). On the other hand, if the number of bits to be deleted is assumed to be 4 (the number of trim_bits is 4), max_diff is 1 (see FIG. 9D). If it is assumed that the number of trim_bits is 5, max_diff is 2 (see FIG. 9E). Then, a histogram as shown in FIG. 8A is created. The horizontal axis of this histogram is max_diff, and the vertical axis thereof is the number of bits to be deleted (trim_bit) (the number of trim_bits). Maximum values of both the vertical axis and the horizontal axis are the finite bit numbers, and are bit numbers representing converted coefficients (AC coefficients). From this histogram, the number of macro blocks in which distortion of a predetermined magnitude has occurred existing in the entire image is clear when the number of trim_bits is set. Note that it is assumed that when macro blocks having distribution of FLEXBITS as shown in FIG. 9A are analyzed, the histogram up to that time is shown in FIG. 8A. In this case, after analysis, according to the macro block of interest, the histogram is updated as shown in FIG. 8B. In the case where FLEXBITS of the macro block of interest and the eight adjoining macro blocks are in the state of FIG. 9A, even if 3 bits starting from the least significant bit of FLEXBITS in encoded data obtained by encoding are deleted, distortion does not occur in the vicinity of the macro block of interest. Accordingly, as shown in FIG. 8B, in the range where the number of trim_bits is between 1 to 3, frequency in which max_diff is zero increases by "1". Further, when 4 bits starting from the least significant bit of FLEX-BITS are the deletion targets, distribution of FLEXBITS of the macro block of interest and the macro blocks in the vicinity thereof are in the state of FIG. 9D, and thus max_diff is 1. For that reason, as shown in FIG. 8B, if the number of trim_bits is 4, frequency in which max_diff is 1 increases by "1". It will not be necessary to describe other cases.

Figure 11:
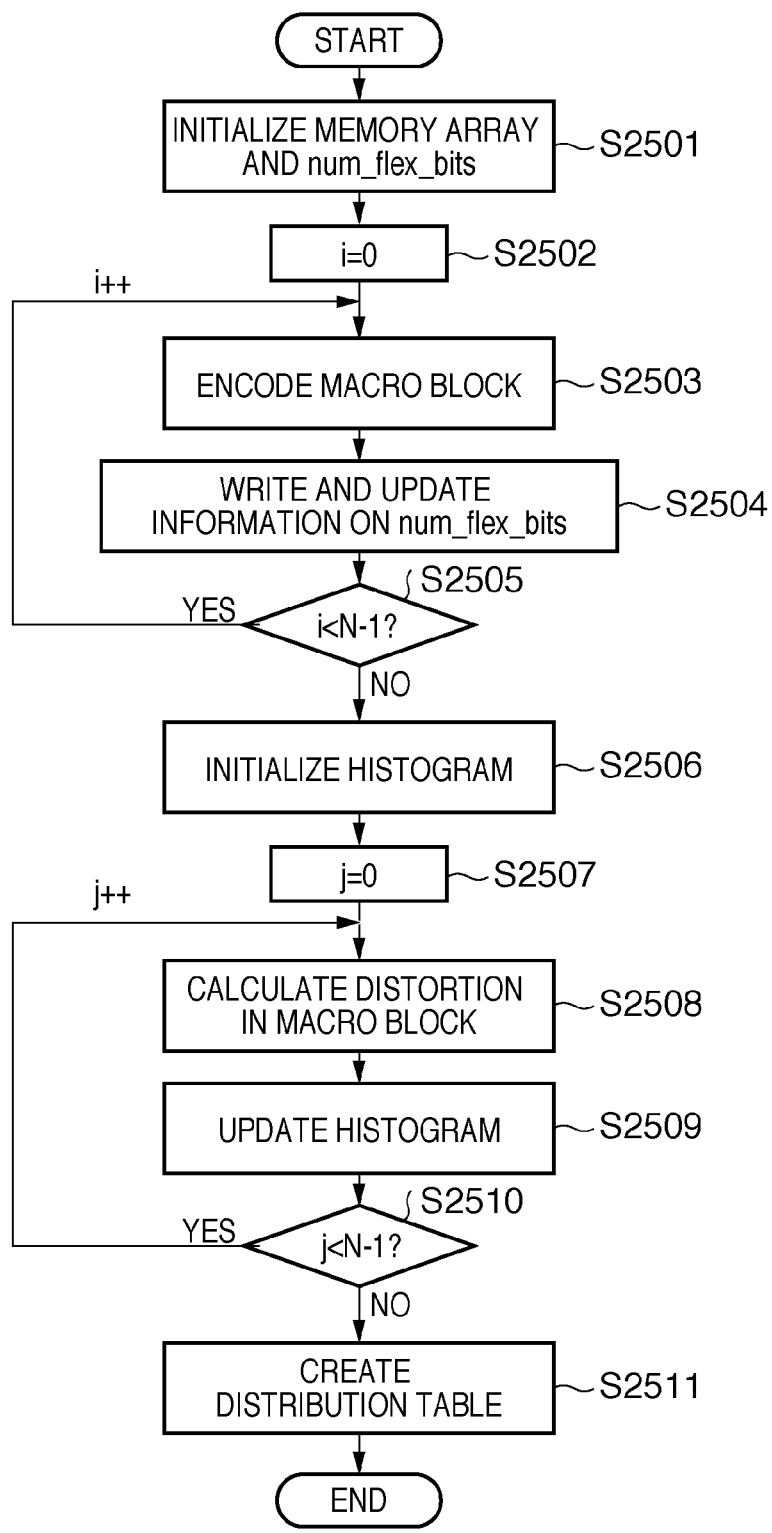
FIG. 11 is a flowchart for generating a distribution table showing the occurrence of distortion in the first embodiment.

If calculation of distortion (feature value) ends with respect to all the macro blocks, a distribution table showing rates of the occurrence of distortion is generated. This generation method is described using FIGS. 10A and 10B. FIG. 10A is a histogram after analysis of all the macro blocks in an image has ended. The occurrence frequency in this histogram is divided by the number of macro blocks in the image, and the appearance ratio of each case is calculated. FIG. 10B shows the calculated ratios and is a distribution table showing rates of the occurrence of distortion (hereinafter, referred to as distribution table). When FLEXBITS are deleted, the number of trim_bits is determined based on this distribution table. In that diagram, in the case where macro blocks having distortion of 3 bits or more constitute 10 percent or more of the entire image (a user instructs this rate from an instruction unit (not shown)), if this state is unallowable as image quality of the entire image, it is determined that the number of trim_bits is 3. Note that processing performed by the entropy encoding unit 106 is until generating such a distribution table, and determination of the number of trim_bits is processing performed by the code stream generating unit 107. Here, the flow of processing from when macro blocks are encoded until when a distribution table is generated is described using the flowchart in FIG. 11.

Upon the start of the entropy encoding, the code stream generating unit 107 sets an initial value in num_flex_bits, first. Then, with respect to all the macro blocks, a memory array (array_num_flex_bits( ) for storing num_flex_bits is initialized (S2501). Note that in the embodiment, the size of one macro block is a 16×16 pixel size. Further, since an encoding target image is not divided into tiles (an encoding target image=one tile), supposing that the number of pixels in the horizontal direction of the encoding target image is W, and the number of pixels in the vertical direction thereof is H, the number of total tiles N is given by the following equation: N=Ceiling(W/16)×Ceiling(H/16). Accordingly, memory array array_num_flex_bits( ) equivalent to this number will also be secured in a memory (not shown).

Next, a macro block counter i is initialized to 0 (S2502), the first macro block in the raster scan order is encoded using num_flex_bits (the initial value thereof is 2, which has already been described) (S2503). Upon the end of encoding the macro block, num_flex_bits is stored in array_num_ flex_bits(i), and thereafter the number of non-zero coefficients (num_NonZero) included in the upper-bit portion of the encoded macro block is analyzed. Then, num_flex_bits is updated in preparation for encoding of the next macro block (S2504).

If num_NonZero is greater than a preset threshold value num_Th, the value of num_flex_bits is incremented by 1, given that the region around the encoded macro block is considered to be a region in which a large number of non-zero coefficients occur in the upper bits. On the contrary, if it is smaller, the value of num_flex_bits is decremented by 1 (S2504). Note that in S2504, information is stored each time processing on a macro block ends. Then, the macro block counter i is compared with the number of macro blocks N−1. If i is smaller, the macro block counter i is incremented, and the processing returns to S2503 for encoding the next macro block. If i and N−1 are the same, which means that encoding on all the macro blocks has completed so far, the processing proceeds to S2506.

A histogram is initialized in step S2506. Subsequently, a macro block counter j is initialized to 0 (S2507), distortion in each macro block is calculated (S2508). Calculation of distortion in the macro blocks is as follows.

Now, it can be understood that the number of FLEXBITS of a jth macro block, which is a macro block of interest, can be obtained from array_num_flex_bits(j). In the embodiment, since one tile corresponds to an original image, the number of macro blocks arranged in the horizontal direction that exist in a tile is the same as the number of tiles ceiling (W/16) arranged in the horizontal direction of the original image. Supposing that ceiling (W/16) is "w", the FLEXBITS numbers of eight macro blocks adjoining the macro block of interest with a start in FIG. 9A can be obtained from array_num_flex_bits(j−w−1), array_num_flex_bits(j−w), array_num_flex_bits(j−w+1), array_num_flex_bits(j−1), array_num_flex_bits(j+1), array_num_flex_bits(j+w−1), array_num_flex_bits(j+w), and array_num_flex_bits(j+w+1). Consequently, distortion (feature value) with respect to the macro block of interest can be calculated.

When distortion in the macro block of interest is calculated, the histogram is updated (S2509). Then, variable j is compared with the value of N−1 (S2510). If j is smaller, j is incremented, and thereafter the processing returns to S2508. If j is not smaller, an occurrence distribution table is generated (S2511), and the processing ends.

Figure 15A:
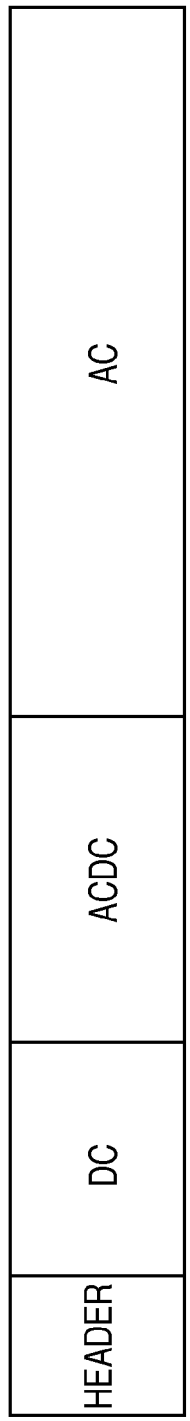
Figure 15B:
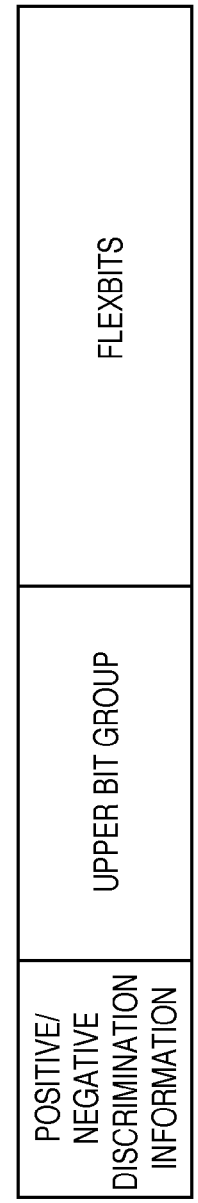

Upon the end of entropy encoding as described above, the code stream generating unit 107 generates a header in the memory (not shown), and arranges encoded data subsequently thereto in the order of DC, ACDC, and AC, which is the order of frequencies, as shown in FIG. 15A. Note that with regard to AC, as shown in FIG. 15B, positive/negative discrimination information of the entire image is collected, and the upper bit groups of the entire image are collected subsequently to the above collection. FLEXBITS of the entire image are arranged at the end. Further, as shown in FIGS. 15C and 15D, each of positive/negative discrimination information and the upper bit group is arranged in the raster scan order in units of macro blocks. The inside of each macro block is arranged in the raster scan order in units of blocks. Moreover, with regard to data in each block, data pieces of components are arranged in the raster scan order. Moreover, as shown in FIG. 15E, FLEXBITS are arranged in the raster scan order in units of macro blocks. The inside of each macro block is arranged in the raster scan order in units of blocks. Moreover, with regard to data in each block, data pieces of components are arranged in the zigzag scan order. Here, the reason for arranging the components of the upper bit group in the zigzag scan order is that encoding is performed in that order. Note that conditions of encoding are collectively described in the header. The conditions of encoding include the vertical and horizontal size of the image, quantization steps, num_ flex_bit, frequency components, and a pointer to the head of an upper bit group and FLEXBITS. Note that although it is necessary to also describe information on the number of trim_bits in the header, it will be described after finishing later processing for deleting a sign.

Upon generating a code stream as described above, the code stream generating unit 107 performs final processing described below. This final processing is processing for reducing, when the amount of generated encoded data exceeds a preset threshold value rate_Th, that encoding amount as far in the allowable range with regard to image quality deterioration that has been set by the user. Note that if encoding amount reduction is once performed, whether or not the resultant amount of encoded data exceeds the threshold value rate_Th is not considered.

Figure 13:
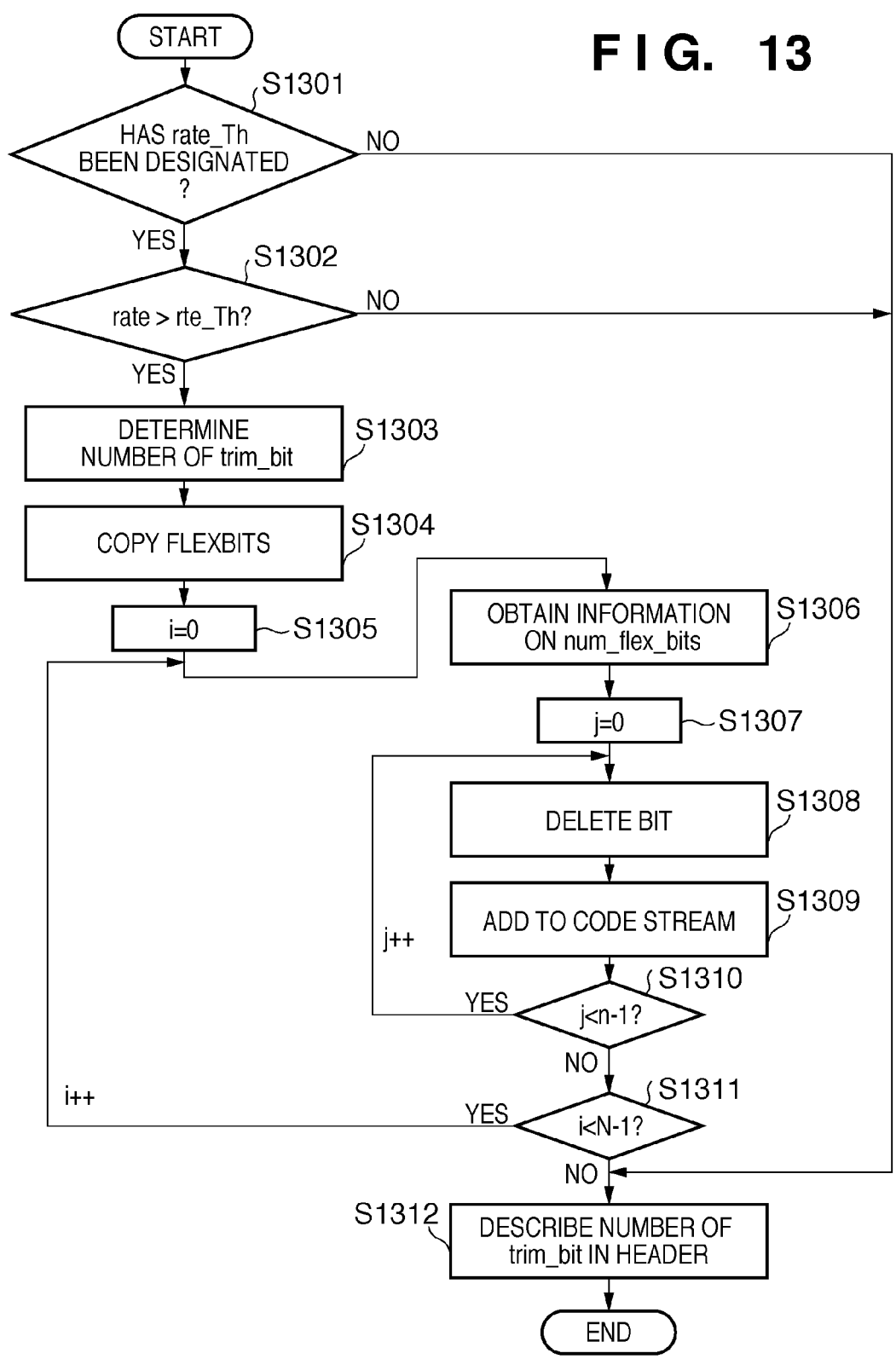
FIG. 13 is a flowchart showing the procedure for deleting FLEXBITS.

Below is a description of such processing in accordance with the flowchart in FIG. 13.

First, the code stream generating unit 107 determines whether or not the threshold value rate_Th has been designated (S1301). If rate_Th is not designated, the number of trim_bits is set to zero, and then is described in a header (S1312), and the processing ends. If rate_Th has been designated, the total amount of encoded data that has been generated (rate) is compared with the threshold value rate_Th (S1302). If the total amount of encoded data is the threshold value or less (if rate≦rate_Th), the processing proceeds to S1312, whereas if the amount of encoded data is greater than the threshold value (if rate>rate_Th), the processing proceeds to S1303, where the number of trim_bits is determined under the conditions based on the allowable range with regard to image quality deterioration.

The number of trim_bits is determined such that macro blocks in which the magnitude of distortion exceeds the allowable range constitute a predetermined rate or less. For example, assume that a distribution table is a table in FIG. 10B, and the condition indicating the allowable range designated by the user is that "the rate of the occurrence of max_diff being "3" is 10% or less". The value of maximum trim_bit that satisfies this condition is "3" from FIG. 10B. Specifically, it is determined that the number of trim_bits is 3. Note that the magnitude of distortion in the allowable range and a predetermined rate are designated in advance from the outside.

After the number of trim_bits is determined in this way, the code stream generating unit 107 moves FLEXBITS of all the macro blocks in the code stream generated previously to a work memory (not shown) (S1304). Next, the macro block counter i is initialized to 0 (S1305), and num_flex_bits of the ith macro block, which is a macro block of interest, is acquired based on information of array_num_flex_bits (S1306). For example, if array_num_flex_bits( ) is in the state of FIG. 7A and the bit number i is 0, it can be seen that num_flex_bits is 2 (since array_num_flex_bit(0) is 2). Subsequently, the coefficient counter j of the blocks in the ith macro block of interest is initialized to 0 (S1307). In the embodiment, an example in which one macro block is constituted by 4×4 blocks is described, the value of the coefficient counter j is 4×4−1, that is, 15 at the maximum. Bits equal to the number of lower trim_bits are deleted from the FLEXBITS of the jth block, and added to the tail end of the upper bit group in the code stream (S1309).

Note that processing for reducing FLEXBITS is described once. The code stream generating unit 107 compares num_flex_bits of the macro block of interest with the number of trim_bits determined in S1303 described above, and executes either of the following processes according to the comparison result.

If num_flex_bits≧the number of trim_bits:

The code stream generating unit 107 deletes data of FLEXBITS of the blocks in the macro block of interest equivalent to the number of lower trim_bits.

If num_flex_bits<the number of trim_bits:

The code stream generating unit 107 deletes data of FLEXBITS of the blocks in the macro block of interest equivalent to the number of lower num_flex_bits, in other words, all the FLEXBITS in the blocks.

Subsequently, assuming that the number of blocks in a macro block is n, j is compared with n−1 (=15) (step S1310). If j is less than n−1, j is incremented, and the processing returns to S1308. If j is not less than n−1 (if j=n−1), this means that the deleting processing with respect to all the blocks in the macro block of interest has ended, and thus i is compared with N−1 for reduction on the next macro block (S1311). If i is less than N−1, i is incremented, and the processing returns to S1306, whereas if i is not less than N−1 (if i=N−1), it is determined that bit deletion has ended, and the processing proceeds to S1312. Upon the end of processing in S1312, the entire processing ends. After that, the code stream generating unit 107 converts data into the data structure in the preset format, and outputs the resultant data.

As described above, since the number of bits to be deleted is determined after an index of the occurrence of distortion (feature value) is obtained, the encoding amount can be reduced while suppressing the occurrence of distortion.

Note that although processing for deleting FLEXBITS is performed in the case where the encoding amount "rate" obtained by the first encoding processing exceeds rate_Th in the above embodiment, processing for deleting FLEXBITS may be performed, regardless of the volume of the encoding amount "rate". In this way, after encoding processing has ended, the encoding amount can be further reduced within the range that the user allows.

Second Embodiment

In the first embodiment, a method for defining the rate of the occurrence of macro blocks having distortion greater than or equal to a predetermined value as an index (feature value) of the occurrence of distortion, and calculating the index has been described. However, with this method, calculation is performed for each macro block, which takes time for processing, and thus a simple method is desired in some cases. In the present embodiment, as an index (feature value) of the occurrence of distortion, an example in which an estimate of a rate of the occurrence of macro blocks having distortion greater than or equal to a predetermined value is calculated in a further simplified manner is described.

Specifically, each of the macro blocks is not focused on, but the frequency distribution of FLEXBITS is generated in units of rows of macro blocks (hereinafter, macro block row). In the distribution, the bit number of FLEXBITS that appears most frequently is used as a representative of FLEXBITS of a macro block row of interest (the number of bits used as a representative will be referred to as representative number of bits). Next, a plurality of bit numbers to be deleted are postulated, diff between macro block rows is calculated, and a histogram corresponding to FIG. 8A is generated. Then, when processing on all the macro blocks in an image ends, thereby completing generation of a histogram, a distribution table is generated. Note that the flow of processing is almost the same as that in the first embodiment, and thus description is limited to be given on only a method for calculating an estimate of the occurrence of distortion.

Figure 12:
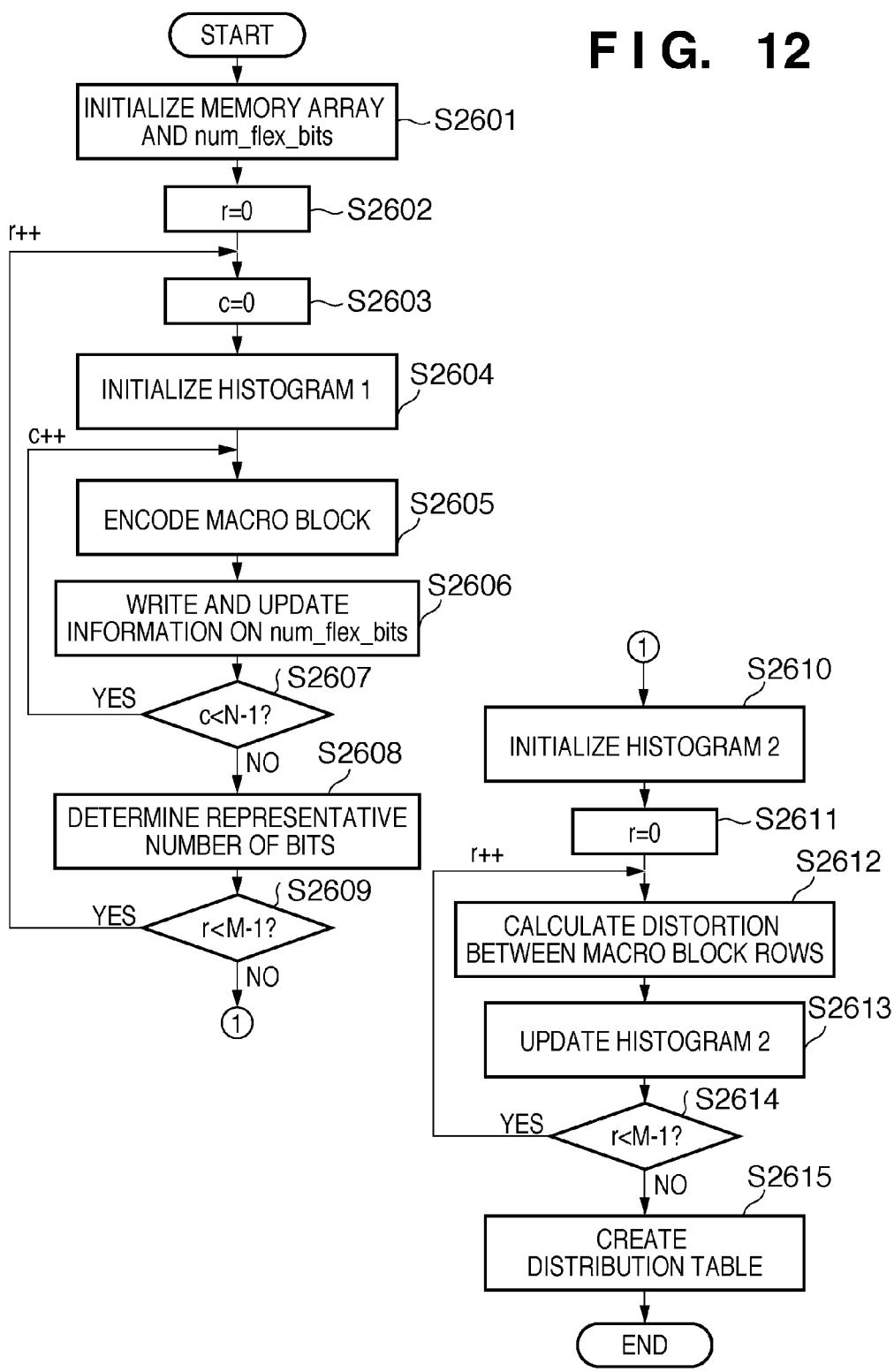
FIG. 12 is a flowchart for generating a distribution table showing the occurrence of distortion in a second embodiment.

FIG. 12 is the flow of processing for generating a distribution table showing the occurrence of distortion performed by the code stream generating unit 107 in a second embodiment of the present invention. Note that in the description below, the number of macro blocks in the horizontal direction of a tile is N, and the number of macro blocks in the vertical direction thereof is M. Further, a histogram 1 stores frequency of FLEXBITS when each of the N macro blocks horizontally arranged is encoded, and is secured in a region in the memory (not shown). Here, N macro blocks horizontally arranged are collectively called a macro block row. A histogram 2 stores the representative number of FLEXBITS of a macro block row, and is also secured in a region in the memory (not shown).

First, when processing for generating a distribution table showing the occurrence of distortion starts, the code stream generating unit 107 initializes array_num_flex_bits for storing the representative number of bits of each macro block row to 0, and also sets an initial value (2 in this embodiment) in num_flex_bits (S2601). Subsequently, a row counter r is initialized (S2602), and a column counter c is initialized (S2603). Moreover, the histogram (histogram 1) for num_flex_bits in a macro block row is initialized (S2604). Subsequently, each macro block in a macro block row of interest is encoded (S2605). At this time, num_flex_bits is updated in accordance with the number of non-zero coefficients included in the upper-bit portion of each macro block obtained when encoding is performed, which is the same as in the first embodiment. Further, when each macro block is encoded, the histogram 1 is updated according to the value of num_flex_bits used at that time (S2606). After this, the column counter c is compared with N−1 (S2607). Specifically, it is determined whether or not a macro block previously encoded is a macro block at the end of the macro block row. If c<N−1, c is incremented, and the processing returns to S2605. In the case other than that, the representative bit number of FLEXBITS of the macro block row of interest is determined (S2608).

Subsequently, the row number r of a macro block row is compared with M−1 (S2609). If r<M−1, r is incremented, and the processing returns to S2603. In the case other than that, which means the representative number of bits has been determined with respect to all the macro block rows, the histogram (histogram 2) for storing calculated values of distortion is initialized (S2610). This histogram 2 is a histogram corresponding to FIG. 8A in the first embodiment. Next, the row counter r is initialized (S2611). Then, a difference between the macro block row of interest and the next macro block row in the number of bits to be decoded (corresponding to diff in the first embodiment) is calculated (S2612), and the histogram 2 is updated (S2613). Next, the value of r is compared with that of M−1 (S2614), and if r is smaller, r is incremented, and the processing returns to S2612. If not, a distribution table showing the occurrence of distortion is created (S2615), and the processing ends.

As described above, a method for calculating an estimate (feature value) of the occurrence of distortion, and thereafter reducing the encoding amount while suppressing the occurrence of distortion has been described.

Other Embodiments

Although the maximum value of diff between a pixel block of interest and adjoining pixel blocks is regarded as distortion in a pixel block (macro block) constituted by a plurality of pixels in the first embodiment, a part of adjoining pixel blocks or all of them may be selected, and the sum of diff may be regarded as distortion (feature value). Specifically, when the valid bit number of converted coefficients represented by the lower-bit portion remaining after deletion and the upper-bit portion of the pixel block of interest when it is assumed that the number of bits i to be deleted is changed to 1, 2, and so on is defined as $S(i, 0)$, and the valid bit number of converted coefficients represented by the lower-bit portion remaining after deletion and the upper-bit portion of each of m neighboring pixel blocks excluding the macro block of interest that are positioned in a two-dimensional region within a preset distance from this block of interest is defined as $S(i, j)$ ($j=1, 2, \ldots, m$), a difference sum value sum_diff(i) with respect to the bit number i is obtained as $$\mathrm{sum\_diff}(i) = \Sigma |S(i, 0) - S(i, j)|,$$

and a histogram constituted by the bit number i and the frequency for the sum_diff(i) is created. FIG. 10C is an example thereof. Then, the appearance ratio for the bit number i and sum_diff(i) is calculated by dividing this frequency by the number of pixel blocks that appear.

The same processing as in the above embodiment is performed after this. Specifically, when the value of allowable sum_diff(i) and the appearance ratio thereof have been set, the code stream generating unit 107 obtains, from the histogram, a value at which the bit number i is maximized at or below the sum_diff(i) and the appearance ratio thereof that have been set, and determines the bit number i as the number of bits to be deleted. Note that such processing is also applicable to the second embodiment in which determination is performed in units of pixel block rows.

The first embodiment focuses on the difference between a macro block of interest and adjoining macro blocks in the bit number of FLEXBITS. However, a difference (feature value) in the bit number of FLEXBITS in the range of a preset distance from the macro block of interest (between the macro block of interest and macro blocks that are distant by N (N>2) if the distance between adjoining macro blocks is 1) may be observed.

In the first embodiment, although a rate of the occurrence of MBs having a distortion greater than or equal to a predetermined value is used as an index (feature value), the way to select an index is not limited to this. For example, distortion that occurs in each MB is calculated using diff. Then, an average value of distortion for the entire image may be derived, and the obtained value may be used as an index (feature value).

Figure 14A:
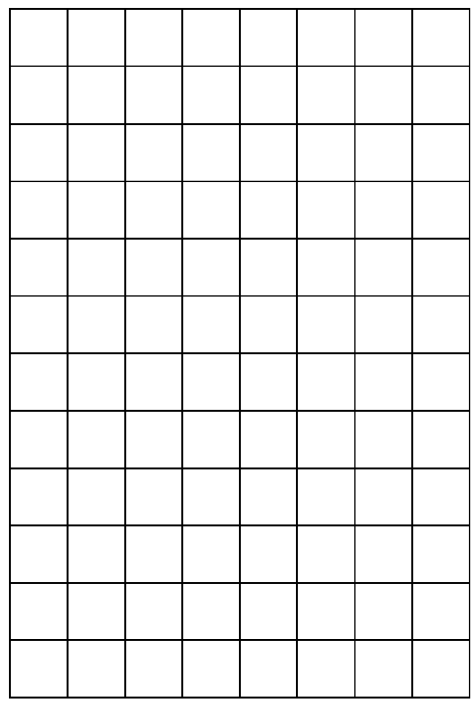
FIGS. 14A and 14B are explanatory diagrams of macro blocks that are targets whose information on num_flex_bits is held.
Figure 14B:
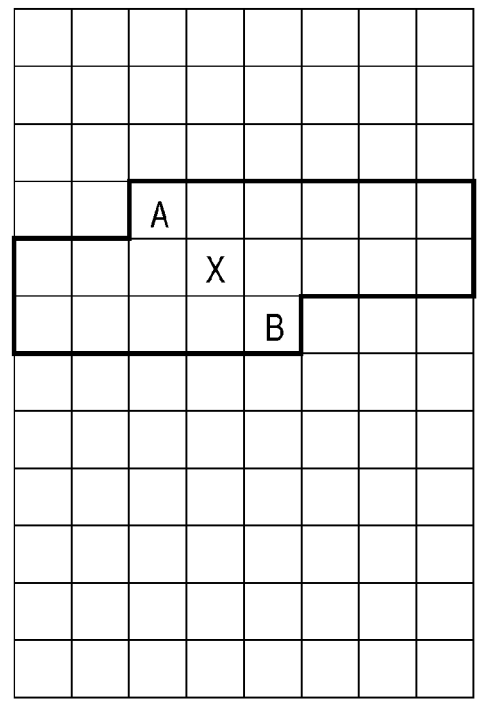

In the first embodiment, a method for generating a histogram showing distortion in macro blocks after information on num_flex_bits of all the macro blocks is stored has been described. However, the scope of the present invention is not limited to this, and a method for generating a histogram (feature values) with information on minimum num_flex_bits being held in the course of entropy encoding may be adopted. An example of such a method is described using FIGS. 14A and 14B. FIG. 14A shows a state where an image is divided into macro blocks. If encoding is performed in the raster scan order in units of macro blocks, it is sufficient that macro blocks with respect to which information on num_flex_bits should be held at the minimum are macro blocks in a thick frame in the diagram at the point in time when entropy encoding on macro block B in FIG. 14B has ended. That is, if information on num_flex_bits with respect to the macro blocks in the range enclosed by the thick black frame is held, the magnitude of distortion that may occur can be analyzed based on information on num_flex_bits of the macro blocks surrounding macro block X. Thus, information in the histogram can be updated. When processing further proceeds to be performed on the next macro block, information on num_flex_bits of macro block A is discarded, and the processing is repeated. Note that information on num_flex_bits of the entire image is not held with this method. Accordingly, at a step of deleting FLEXBITS, it is necessary to decode the upper bit group of the AC components and to generate information on num_flex_bits. Specific description with regard to this processing is given using FIG. 7A. FIG. 7A is an example of distribution of upper bit groups and FLEXBITS in the case where macro blocks of an image is seen in the raster scan order. As described in the first embodiment, num_flex_bits is 2 with respect to the macro block given number 0, and is similarly 2 when decoding is performed. Next, the macro block given number 0 is decoded, and the number of non-zero coefficients is counted. If the counted number is a predetermined number or more, num_flex_bits of the next macro block is incremented by 1. On the contrary, if the counted number is less than the predetermined number, num_flex_bits thereof is decremented by 1. Macro blocks given number 1 and subsequent numbers are also decoded, and information on num_flex_bits is acquired.

In the second embodiment, as a method for using an estimate of the occurrence of distortion as an index, a method for using the bit number of FLEXBITS serving as a representative in units of macro block rows has been described. However, the scope of the present invention is not limited to this, and it is sufficient if the method is a method for calculating an estimate of the occurrence of distortion as a feature value without actually calculating distortion that occurs in each MB. For example, as a simpler method, frequency distribution is generated with respect to the bit number of FLEXBITS of each macro block, the possibility of the occurrence of a difference in image quality may be estimated based on this. The reason why a difference in image quality can be estimated based on this frequency distribution is briefly described. When FLEXBITS are deleted by a certain number of trim_bits T, T bits cannot be deleted from a macro block whose bit number of FLEXBITS is less than T. Accordingly, a difference in image quality, that is, the number of bits to be decoded varies. Further, a possibility that the rate of the occurrence of great distortion increases is higher, the more variations the number of bits to be decoded has. More specifically, when trim_bit is 4, if an image including only 10 percent of MBs from which only 1, 2 or 3 bits can be deleted is compared with an image including 50 percent of such MBs, it can be considered that the latter image has a higher possibility that great distortion occurs more. Therefore, when the numbers of trim_bit are each set based on the frequency distribution, the rate of the occurrence of MBs from which only bits less than trim_bit can be deleted is obtained, and the resultant value can be used as an estimate of the occurrence of distortion.

In the first and second embodiments described above, although the case where tile division is not performed has been described, tile division may be performed. In that case, two methods are conceivable, namely, a deletion method using a coherent number of bits for all the tiles and a deletion method using a coherent number of bits for the entire image, both the methods are within the scope of the present invention. Moreover, not only a deletion method using a coherent number of bits for all the tiles or the entire image, but also a deletion method using the same number of bits for a plurality of arbitrary macro blocks is within the scope of the present invention.

Figure 17A:
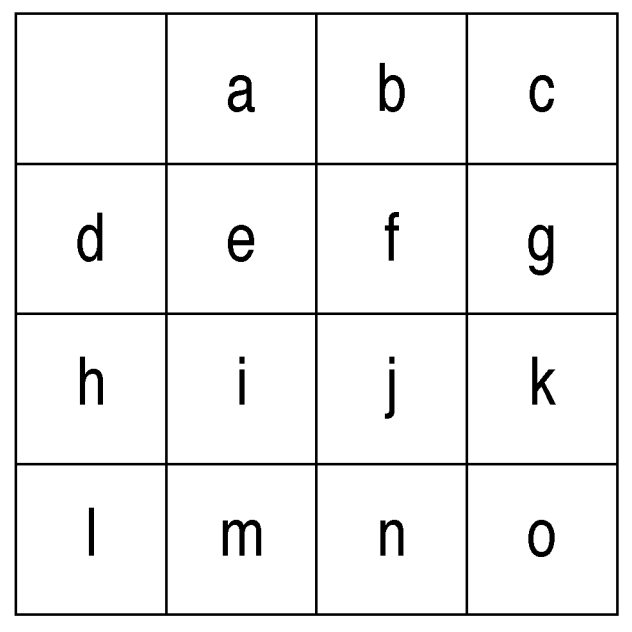

Although a method for giving positive/negative discrimination information to each coefficient has been described in the first embodiment, a method for giving discrimination information only to non-zero (significant) coefficients may be adopted. For example, coefficients are in sign-magnitude representation, and divided into an upper bit group and FLEXBITS. After that, a coefficient whose upper bits are significant is specified. Then, the absolute value of the corresponding coefficient is encoded, and when arranging the generated encoded data in a memory, positive/negative discrimination information is arranged following the encoded data. Further, among coefficients whose upper bits are not significant (insignificant), with respect to a coefficient whose FLEXBITS are significant, positive/negative discrimination information is arranged following a bit string of the corresponding coefficient. In this way, it is not necessary to give positive/negative discrimination information to an insignificant coefficient. If specific description is given using numerals in the diagrams, an address is assigned to each block as shown in FIG. 17A, and coefficients are distributed as shown in FIG. 17B. Further, if num_flex_bits is 2, distribution of the upper bit groups and FLEXBITS is as shown in FIG. 17C. Encoded data of the upper bit groups and positive/negative discrimination information are considered based on FIG. 17C, which is as shown in FIG. 17D. Further, FLEXBITS are as shown in FIG. 17E. As a result, positive/negative discrimination information does not need to be given to c and h having insignificant coefficients.

Note that if FLEXBITS includes both a coefficient that has positive/negative discrimination information and a coefficient that does not have such information as described here, information on distribution of positive/negative discrimination information is necessary in order to delete a bit of FLEXBITS. That is because the bit of positive/negative discrimination information cannot be specified without this information. In order to solve this problem, a distribution map of positive/negative discrimination information (hereinafter, referred to as distribution map) is generated in the course of encoding, as shown in FIG. 17F. That diagram shows that a coefficient of the address with "0" does not have positive/negative discrimination information for FLEXBITS, and a coefficient of the address with "1" has the information. If a bit is actually deleted, a bit to be deleted is determined based on the distribution map. Specifically, consider the case where FLEXBITS in FIG. 17E are deleted assuming that trim_bit is 1. From the distribution map, it can be seen that positive/negative discrimination information exists immediately after FLEXBITS of address b, d, f, i, and so on. Accordingly, when FLEXBITS of c are accessed, a pointer is moved to the sixth bit from the head of a code stream including positive/negative discrimination information of FLEXBITS, 2 bits are acquired, and 1 bit is deleted. Address d and thereafter are accessed in the same way. As a result, it is possible to delete FLEXBITS.

Although an example in which the present invention is applied to JPEG XR has been described in the above embodiments, it is not limited to JPEG XR. Specifically, it is because the present invention is applicable to encoding technology of inputting a pixel block constituted by a plurality of pixels (macro block in the embodiments), performing frequency conversion on image data in the input pixel block, separating all or a part of the result of frequency conversion into an upper-bit portion that is higher than a boundary bit position for updating in units of pixel blocks and a lower-bit portion that is lower than or equal to the boundary bit position, and performing compression encoding on the upper-bit portion, whereas outputting the lower-bit portion in a non-compression state. In this case, with respect to each bit number i representing the number of bits to be deleted in the case where the bit number i is assumed to be changed to 1, 2, and so on in the range of the finite number of bits representing converted coefficients, the valid bit number of a converted coefficient represented by the lower-bit portion remaining after deletion and the upper-bit portion is obtained for each pixel block, and a distortion evaluation value (feature value) of an image for each bit number i is calculated from the relationship between each bit number i and the number of valid bits. Then, a value at which the bit number i is maximized at or below an allowable distortion value that has been set is obtained from among the calculated evaluation values, and it is sufficient to determine this bit number i as the number of bits to be actually deleted.

As a method for processing an upper bit and a lower bit, although a method in which an upper bit is encoded and a lower bit is not encoded has been described, the method is not limited to this. A method in which a lower bit is encoded may be used to aim at further improved compressibility. Specifically, multilevel encoding such as Huffman encoding is performed on an upper bit, and with regard to a lower bit, binary arithmetic encoding such as bit-plane encoding in units of blocks may be used so as to enable deletion in units of bits.

Although a method for referring to information on a macro block previous to a macro block of interest as a criterion for changing a boundary bit position has been described, the present invention is not limited to this. For example, a method for focusing on the amount of change in the number of significant coefficients of upper bits between the previous macro block and a macro block previous thereto is also conceivable. More specifically, if the above amount of change is large, the amount of change between the previous macro block and the macro block of interest is also large. A method may also be applied in which if the number of significant coefficients of upper bits in the previous macro block is a predetermined value or more, it is determined that there is a high probability that the number of significant coefficients of upper bits in the macro block of interest is large, and thus the position of a boundary bit is lowered.

Further, the number of significant coefficients of upper bits in a macro block located at a higher position in the sub-scanning direction (higher macro block) rather than only in the previous macro block may also be referred to. Specifically, a method is conceivable in which if both the number of significant coefficients of upper bits in the previous macro block and the number of significant coefficients of upper bits in the higher macro block are greater than or equal to a predetermined number, a boundary bit is lowered.

Although a method using the number of significant coefficients of upper bits in a macro block as a criterion for changing a boundary bit position has been described, the method is not limited to this. For example, in the case where a region of interest (ROI) expressed by an integral multiple of a macro block and a pixel block described in the embodiments is determined in an image, bits in ROI are not desired to be deleted as many as possible, relative to the surrounding region surrounding ROI. Based on this idea, the number of pixels included in ROI (pixels of interest) is counted with respect to the macro blocks, and the rate thereof is calculated. It is determined that a macro block having pixels of interest that constitute a certain rate or more is an important macro block. Then, in encoding of an important macro block, a method for lowering a boundary bit by 1 bit is also conceivable. That is, a method using the rate of pixels of interest in a macro block as a criterion is also within the scope of the present invention.

Further, a method for changing a boundary bit position based on the number of significant coefficients of upper bits and the rate of pixels of interest, which has been described in the first embodiment, is also conceivable. Specifically, the method is as follows: if significant coefficients greater than or equal to a threshold value exist in upper bits in an important macro block, a boundary bit is lowered by 2, and if significant coefficients less than the threshold value, a boundary bit is lowered by 1. On the other hand, if it is not an important macro block, a boundary bit is changed as in the first embodiment.

Note that with this method, since it is considered that distortion that occurs between adjoining macro blocks due to a 2-bit difference is in an allowable range, the difference in the number of bits considered to be distortion will be 3 bits or more.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-025857, filed Feb. 8, 2010, which is hereby incorporated by reference herein in its entirety.

What is claimed is:

1. An image encoding apparatus that encodes image data, comprising:
   an input unit that inputs pixel blocks each constituted by a plurality of pixels, in a preset scanning order, from encoding target image data;
   an encoder that performs frequency conversion on image data in each pixel block input by the input unit, separates converted coefficients obtained by the frequency conversion into an upper-bit portion that is higher than a bit position specified by a boundary bit position determined based on a predetermined criterion and a lower-bit portion that is lower than or equal to the boundary bit position, and generates encoded data;
   a deletion unit that deletes a portion equivalent to a set number of bits N, with respect to the lower-bit portion generated from each pixel block in the encoded data generated by the encoder, and when the boundary bit position in a pixel block of interest is n,
   deletes N bits starting from a least significant bit of the lower-bit portion of the pixel block of interest if N≦n, and
   deletes bits starting from the least significant bit of the lower-bit portion of the pixel block of interest up to the n bit if N>n;
   a calculating unit that calculates, for an entire image, distortion that occurs due to encoded data being deleted by the deletion unit;
   a setting unit that sets an allowable distortion value; and
   a code stream generating unit that obtains a value at which a number of bits i is maximized at or below the allowable distortion value set by the setting unit, from among evaluation values calculated by the calculating unit, determines the bit number i as the number of bits N to be deleted by the deletion unit, causes the deletion unit to execute deletion, converts encoded data remaining after deletion into a data structure in a preset format, and outputs the resultant data.

2. The image encoding apparatus according to claim 1, wherein the calculating unit calculates distortion for the entire image, based on a difference between a region of interest constituted by the pixel block and each surrounding region that exists around the region of interest in the number of bits to be decoded.

3. An image encoding apparatus that encodes image data, comprising:
   an input unit that inputs sample blocks each constituted by a plurality of samples, in a preset scanning order, from encoding target image data;
   an encoder that separates the sample blocks into an upper-bit portion that is higher than a bit position specified by a boundary bit position determined based on a predetermined criterion and a lower-bit portion that is lower than or equal to the boundary bit position, and generates encoded data;
   a deletion unit that deletes a portion equivalent to a set number of bits N, with respect to the lower-bit portion generated from each sample block in the encoded data generated by the encoder, and when the boundary bit position in a sample block of interest is n, deletes N bits starting from a least significant bit of the lower-bit portion of the sample block of interest if N≦n, and deletes bits starting from the least significant bit of the lower-bit portion of the sample block of interest up to the n bit if N>n;

an estimation unit that estimates, for an entire image, distortion that occurs due to encoded data being deleted by the deletion unit, based on the boundary bit position;

a setting unit that sets an allowable distortion value; and a code stream generating unit that obtains a value at which a number of bits i is maximized at or below the allowable distortion value set by the setting unit, from among evaluation values calculated by the calculating unit, determines the bit number i as the number of bits N to be deleted by the deletion unit, causes the deletion unit to execute deletion, converts encoded data remaining after deletion into a data structure in a preset format, and outputs the resultant data.

4. The image encoding apparatus according to claim 2, wherein the region of interest is a region composed of an integral multiple of the pixel block.

5. The image encoding apparatus according to claim 2, wherein the region of interest is a region composed of a plurality of the pixel blocks horizontally arranged.

6. The image encoding apparatus according to claim 2, wherein the calculating unit performs the calculation based on a maximum value of a difference between the region of interest and each surrounding region in the number of boundary bits.

7. The image encoding apparatus according to claim 2, wherein the calculating unit performs the calculation based on a sum of differences between the region of interest and each surrounding region in the number of boundary bits.

8. The image encoding apparatus according to claim 1, wherein the calculating unit calculates distortion for the entire image based on a rate of occurrence of a pixel block having distortion that exceeds the allowable distortion value, among distortion that occurs in the pixel blocks.

9. The image encoding apparatus according to claim 1, wherein the calculating unit calculates distortion for the entire image based on an average value of distortion that occurs in the pixel blocks for the entire image.

10. The image encoding apparatus according to claim 1, wherein the calculating unit includes:

a creating unit that creates a histogram constituted by the bit number i and a frequency for max_diff(i), where when one pixel block is set as a pixel block of interest, and the max_diff(i) is a maximum difference in a valid bit number of the converted coefficients expressed by the lower-bit portion remaining after deletion and the upper-bit portion of each pixel block when it is assumed that the number of bits i to be deleted by the deletion unit is changed to 1, 2, and so on with respect to each of a plurality of pixel blocks positioned in a two-dimensional region within a preset distance from the pixel block of interest; and a calculating unit that calculates an appearance ratio for the bit number i and the max_diff(i) by dividing the frequency by the number of pixel blocks that appear, the setting unit sets an allowable value of the max_diff(i) and an appearance ratio thereof, and the code stream generating unit obtains, from the histogram, a value at which the bit number i is maximized at or below the max_diff(i) and the appearance ratio thereof set by the setting unit, and determines the bit number i as the number of bits N to be deleted.

11. The image encoding apparatus according to claim 1, wherein the calculating unit has:

a setting unit that obtains the number of lower bits that appears most frequently in a pixel block row constituted by pixel blocks horizontally arranged, and sets the obtained number as a representative number of bits;

a generation unit that postulates a plurality of bit numbers to be deleted, calculates a difference in a number of bits "diff" to be decoded that occurs in each pixel block row using the representative number of bits, and generates a histogram; and a determination unit that determines the number of bits to be deleted based on the histogram.

12. The image encoding apparatus according to claim 1, wherein the calculating unit includes:

a creating unit that obtains a difference sum value sum_diff(i) with regard to the bit number i as $$\text{sum\_diff}(i) = \Sigma |S(i, 0) - S(i, j)|$$

where one pixel block is set as a pixel block of interest, and a valid bit number of the converted coefficients expressed by the lower-bit portion remaining after deletion and the upper-bit portion of the pixel block of interest when it is assumed that the number of bits i to be deleted by the deletion unit is changed to 1, 2, and so on is defined as $S(i, 0)$, and a valid bit number of the converted coefficients expressed by the lower-bit portion remaining after deletion and the upper-bit portion of each of m neighboring pixel blocks excluding the pixel block of interest that are positioned in a two-dimensional region within a preset distance from the pixel block of interest is defined as $S(i,j)$ ($j=1, 2, \ldots, m$), and that creates a histogram constituted by the bit number i and a frequency for the sum_diff(i); and a calculating unit that calculates an appearance ratio for the bit number i and the sum_diff(i) by dividing the frequency by the number of pixel blocks that appear, the setting unit sets an allowable value of the sum_diff(i) and an appearance ratio thereof, and the code stream generating unit obtains, from the histogram, a value at which the bit number i is maximized at or below the sum_diff(i) and the appearance ratio thereof set by the setting unit, and determines the bit number i as the number of bits N to be deleted.

13. The image encoding apparatus according to claim 1, further comprising:

a dividing unit that divides an image to be encoded into a plurality of tiles that each include a plurality of macro blocks, wherein the input unit inputs image data of the tiles divided by the dividing unit as the encoding target image data, and the encoder includes:

a first frequency conversion unit that performs frequency conversion on each of a plurality of blocks constituted by 4×4 pixels included in the macro blocks, and obtains one DC component and 15 AC components per block;

a second frequency conversion unit that generates a DC block by collecting the DC components of the blocks obtained by the first frequency conversion unit, and generates one DC component and 15 ACDC components by performing frequency conversion on the DC block; and an entropy encoding unit that performs entropy encoding on the one DC component and the 15 ACDC components obtained by the second frequency conversion unit, performs encoding after separating the plurality of AC components obtained by the first frequency conversion unit into the upper-bit portion and the lower-bit portion.

14. A control method for an image encoding apparatus that encodes image data, the method comprising:
- an input step of inputting pixel blocks each constituted by a plurality of pixels, in a preset scanning order, from encoding target image data;
- an encoding step of performing frequency conversion on image data in each pixel block input in the input step, separating converted coefficients obtained by the frequency conversion into an upper-bit portion that is higher than a bit position specified by a boundary bit position determined based on a predetermined criterion and a lower-bit portion that is lower than or equal to the boundary bit position, and generating encoded data;
- a deletion step of deleting a portion equivalent to a set number of bits N, with respect to the lower-bit portion generated from each pixel block in the encoded data generated in the encoding step, and when the boundary bit position in a pixel block of interest is n,
- deleting N bits starting from a least significant bit of the lower-bit portion of the pixel block of interest if N≦n, and
- deleting bits starting from the least significant bit of the lower-bit portion of the pixel block of interest up to the n bit if N>n;
- a calculating step of calculating, for an entire image, distortion that occurs due to encoded data being deleted in the deletion step;
- a setting step of setting an allowable distortion value; and
- a code stream generating step of a code stream generating unit obtaining a value at which a number of bits i is maximized at or below the allowable distortion value set in the setting step, from among evaluation values calculated in the calculating step, determining the bit number i as the number of bits N to be deleted in the deletion step, causing the deletion step to be executed, converting encoded data remaining after deletion into a data structure in a preset format, and outputting the resultant data.

15. A non-transitory computer-readable storage medium storing therein a program that causes a computer to function as the image encoding apparatus according to claim 1 by the computer reading and executing the program.

16. An image encoding apparatus that encodes image data, comprising:
- an input unit that inputs sample blocks each constituted by a plurality of samples, in a preset scanning order, from encoding target image data;
- an encoder that separates the sample blocks into an upper-bit portion that is higher than a bit position specified by a boundary bit position determined based on a predetermined criterion and a lower-bit portion that is lower than or equal to the boundary bit position, and generates encoded data;
- a deletion unit that deletes a portion equivalent to a set number of bits N, with respect to the lower-bit portion generated from each sample block in the encoded data generated by the encoder, and when the boundary bit position in a sample block of interest is n,
- deletes N bits starting from a least significant bit of the lower-bit portion of the sample block of interest if N≦n, and
- deletes bits starting from the least significant bit of the lower-bit portion of the sample block of interest up to the n bit if N>n;
- a calculating unit that calculates, for an entire image, distortion that occurs due to encoded data being deleted by the deletion unit;
- a setting unit that sets an allowable distortion value; and
- a code stream generating unit that obtains a value at which a number of bits i is maximized at or below the allowable distortion value set by the setting unit, from among evaluation values calculated by the calculating unit, determines the bit number i as the number of bits N to be deleted by the deletion unit, causes the deletion unit to execute deletion, converts encoded data remaining after deletion into a data structure in a preset format, and outputs the resultant data.

17. A control method for an image encoding apparatus that encodes image data, the method comprising:
- an input step of inputting sample blocks each constituted by a plurality of samples, in a preset scanning order, from encoding target image data;
- an encoding step of separating the sample blocks into an upper-bit portion that is higher than a bit position specified by a boundary bit position determined based on a predetermined criterion and a lower-bit portion that is lower than or equal to the boundary bit position, and generating encoded data;
- a deletion step of deleting a portion equivalent to a set number of bits N, with respect to the lower-bit portion generated from each sample block in the encoded data generated in the encoding step, and when the boundary bit position in a sample block of interest is n,
- deleting N bits starting from a least significant bit of the lower-bit portion of the sample block of interest if N≦n, and
- deleting bits starting from the least significant bit of the lower-bit portion of the sample block of interest up to the n bit if N>n;
- a calculating step of calculating, for an entire image, distortion that occurs due to encoded data being deleted in the deletion step;
- a setting step of setting an allowable distortion value; and
- a code stream generating step of a code stream generating unit obtaining a value at which a number of bits i is maximized at or below the allowable distortion value set in the setting step, from among evaluation values calculated in the calculating step, determining the bit number i as the number of bits N to be deleted in the deletion step, causing the deletion step to execute deletion, converting encoded data remaining after deletion into a data structure in a preset format, and outputting the resultant data.

* * * * *